(12) United States Patent
Sawada

(10) Patent No.: US 10,720,301 B2
(45) Date of Patent: Jul. 21, 2020

(54) ABERRATION CORRECTOR AND ELECTRON MICROSCOPE

(71) Applicant: JEOL Ltd., Tokyo (JP)

(72) Inventor: Hidetaka Sawada, Tokyo (JP)

(73) Assignee: JEOL Ltd., Tokyo (JP)

(*) Notice: Subject to any disclaimer, the term of this patent is extended or adjusted under 35 U.S.C. 154(b) by 0 days.

(21) Appl. No.: 16/255,026

(22) Filed: Jan. 23, 2019

(65) Prior Publication Data
US 2019/0228945 A1    Jul. 25, 2019

(30) Foreign Application Priority Data
Jan. 24, 2018 (JP) ................. 2018-009999

(51) Int. Cl.
*H01J 37/153* (2006.01)
*H01J 37/26* (2006.01)

(52) U.S. Cl.
CPC .......... *H01J 37/153* (2013.01); *H01J 37/261* (2013.01); *H01J 2237/1405* (2013.01); *H01J 2237/1532* (2013.01); *H01J 2237/1534* (2013.01); *H01J 2237/28* (2013.01)

(58) Field of Classification Search
CPC ........ H01J 37/26; H01J 37/153; H01J 37/261; H01J 2237/1405; H01J 2237/1534
USPC ..... 250/306, 307, 309, 310, 311, 396 R, 397
See application file for complete search history.

(56) References Cited

U.S. PATENT DOCUMENTS

| 8,178,850 B2* | 5/2012 | Sawada | H01J 37/145 250/396 R |
| 8,785,880 B2* | 7/2014 | Sawada | H01J 37/153 250/306 |
| 2009/0032709 A1 | 2/2009 | Sawada | |
| 2014/0158901 A1 | 6/2014 | Sawada et al. | |
| 2015/0332889 A1* | 11/2015 | Sawada | H01J 37/153 250/311 |

FOREIGN PATENT DOCUMENTS

| JP | 200954565 A | 3/2009 |
| JP | 2014116219 A | 6/2014 |

OTHER PUBLICATIONS

Hosokawa et al., "Development of Cs and Cc correctors for transmission electron microscopy", Microscopy, 2013, pp. 23-41, vol. 62, No. 1, Published by Oxford University Press [on behalf of the Japanese Society of Microscopy].

* cited by examiner

*Primary Examiner* — Nicole M Ippolito
(74) *Attorney, Agent, or Firm* — The Webb Law Firm

(57) ABSTRACT

An aberration corrector for an electron microscope includes a geometric aberration corrector provided with a transfer lens system, wherein the transfer lens system includes an optical system for chromatic aberration correction, the optical system for chromatic aberration correction has a first portion, a second portion, and a third portion disposed along an optical axis, and each of the first portion, the second portion, and the third portion has a thickness in a direction along the optical axis and generates an electromagnetic field having two-fold symmetry in which an electric field having two-fold symmetry and a magnetic field having two-fold symmetry are superimposed.

9 Claims, 27 Drawing Sheets

ABERRATION CORRECTOR AND ELECTRON MICROSCOPE

CROSS-REFERENCE TO RELATED APPLICATION

This application claims priority to Japanese Patent Application No. 2018-009999 filed Jan. 24, 2018, the disclosure of which is hereby incorporated by reference in its entirety.

BACKGROUND OF THE INVENTION

The present invention relates to an aberration corrector and an electron microscope.

In electron microscopes such as a transmission electron microscope (TEM) and a scanning electron microscope (SEM), spherical aberration and chromatic aberration are one of the causes of resolution degradation.

In recent years, spherical aberration correctors have been put to practical use. For example, JP-A-2009-54565 discloses a spherical aberration corrector capable of removing a higher-order aberration while correcting a spherical aberration using three-fold symmetric fields (magnetic fields having three-fold symmetry or electric fields having three-fold symmetry) in three stages.

As more and more spherical aberration correctors are being put to practical use, the development of chromatic aberration correctors is next expected. For example, JP-A-2014-116219 discloses an optical system which corrects a chromatic aberration using superimposed electromagnetic two-fold fields (electromagnetic fields having two-fold symmetry formed by a superposition of an electric field having two-fold symmetry and a magnetic field having two-fold symmetry) in two stages. While the chromatic aberration corrector described in JP-A-2014-116219 adopts superimposed electromagnetic two-fold fields in two stages generated by multipole elements in two stages as a basic configuration, an orbit resembling that of a concave-convex-concave lens is realized by dividing a single multipole element into three portions.

In addition, F. Hosokawa, H. Sawada, Y. Kondo, K. Takayanagi and K. Suenaga, Microscopy 62(1): 23-41 (2013) discloses a result of an experiment of simultaneously correcting a chromatic aberration and a spherical aberration using an apparatus constituted by a spherical aberration corrector and a chromatic aberration corrector connected in tandem.

Connecting a spherical aberration corrector and a chromatic aberration corrector in tandem as described in F. Hosokawa, H. Sawada, Y. Kondo, K. Takayanagi and K. Suenaga, Microscopy 62(1): 23-41 (2013) increases a length along an optical axis and results in a greater overall length of an electron microscope. As a result, for example, a problem in that a height requirement for a room in which the electron microscope is to be installed increases or a problem in that stability of the electron microscope declines may occur.

SUMMARY OF THE INVENTION

The invention can provide an aberration corrector capable of reducing an increase in a length of an optical system and an electron microscope including the aberration corrector.

According to a first aspect of the invention, there is provided an aberration corrector including:

a geometric aberration corrector provided with a transfer lens system, the transfer lens system including an optical system for chromatic aberration correction, the optical system for chromatic aberration correction having a first portion, a second portion, and a third portion disposed along an optical axis, and each of the first portion, second portion, and third portion having a thickness in a direction along the optical axis and generating an electromagnetic field having two-fold symmetry in which an electric field having two-fold symmetry and a magnetic field having two-fold symmetry are superimposed.

According to a second aspect of the invention, there is provided an electron microscope including the aberration corrector described above.

DESCRIPTION OF THE INVENTION

According to an embodiment of the invention, there is provided an aberration corrector for an electron microscope including:

a geometric aberration corrector provided with a transfer lens system, the transfer lens system including an optical system for chromatic aberration correction, the optical system for chromatic aberration correction having a first portion, a second portion, and a third portion disposed along an optical axis, and each of the first portion, second portion, and third portion having a thickness in a direction along the optical axis and generating an electromagnetic field having two-fold symmetry in which an electric field having two-fold symmetry and a magnetic field having two-fold symmetry are superimposed.

In this aberration corrector, a chromatic aberration can be corrected by the optical system for chromatic aberration correction used in the transfer lens system of the geometric aberration corrector. Therefore, in this aberration corrector, a spherical aberration and a chromatic aberration can be corrected. Furthermore, in this aberration corrector, an increase in a length of the optical system can be reduced as compared to a case where, for example, a geometric aberration corrector and a chromatic aberration corrector are connected in tandem.

Embodiments of the invention are described in detail below with reference to the drawings. Note that the following embodiments do not unduly limit the scope of the invention as stated in the claims. In addition, all of the elements described in connection with the following embodiments should not necessarily be taken as essential requirements of the invention.

1. Chromatic Aberration Corrector

Figure 1:
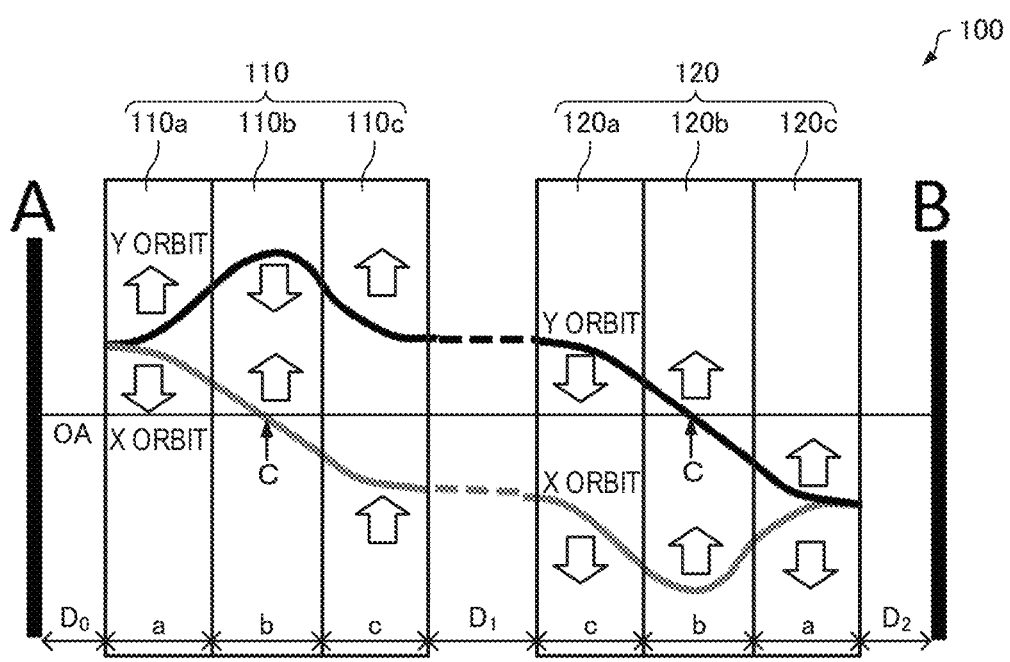
FIG. 1 is a diagram illustrating an optical system of a chromatic aberration corrector.

First, a chromatic aberration corrector used in an aberration corrector according to an embodiment of the invention will be described with reference to the drawings. FIG. 1 is a diagram illustrating an optical system of a chromatic aberration corrector 100 used in an aberration corrector according to an embodiment of the invention. In FIG. 1, the chromatic aberration corrector 100 is disposed between an optical plane A and an optical plane B.

FIG. 1 illustrates an X orbit that is a typical orbit of an electron beam in an X direction and a Y orbit that is a typical orbit of an electron beam in a Y direction. An X axis and a Y axis are perpendicular to an optical axis OA and are mutually orthogonal.

As illustrated in FIG. 1, the chromatic aberration corrector 100 includes a first multipole element 110 (an example of a first optical system for chromatic aberration correction) and a second multipole element 120 (an example of a second optical system for chromatic aberration correction).

The first multipole element 110 and the second multipole element 120 are disposed along the optical axis OA. The optical axis OA is an axis that passes through a center of the first multipole element 110 and a center (a lens center) of the second multipole element 120. The first multipole element 110 and the second multipole element 120 are disposed so as to be mutually separated in a direction along the optical axis OA. In the chromatic aberration corrector 100, the first multipole element 110 and the second multipole element 120 are disposed in this order in a direction of travel of an electron beam. In other words, an electron beam passes through the first multipole element 110 and then enters the second multipole element 120.

The first multipole element 110 is divided into three portions (a first portion 110a, a second portion 110b, and a third portion 110c). In the first multipole element 110, the first portion 110a, the second portion 110b, and the third portion 110c are disposed in this order in the direction of travel of an electron beam. The first portion 110a, the second portion 110b, and the third portion 110c are disposed along the optical axis OA.

The first multipole element 110 generates a first electromagnetic field. Each of the three portions 110a, 110b, and 110c of the first multipole element 110 generates an electromagnetic field having two-fold symmetry (a quadrupole field of superimposed electric and magnetic fields) in which an electric field having two-fold symmetry (an electric quadrupole field) and a magnetic field having two-fold symmetry (a magnetic quadrupole field) are superimposed. The first electromagnetic field is formed by the electromagnetic fields having two-fold symmetry respectively generated by the three portions 110a, 110b, and 110c of the first multipole element 110.

Hereinafter, the three portions 110a, 110b, and 110c of the first multipole element 110 will be described in detail.

Figure 2:
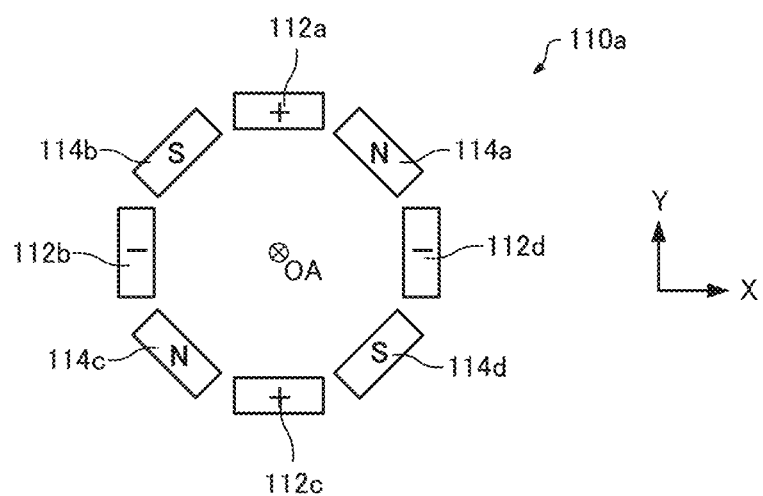
FIG. 2 is a plan view schematically illustrating a first portion of a first multipole element.

First, the first portion 110a of the first multipole element 110 will be described. FIG. 2 is a plan view schematically illustrating the first portion 110a of the first multipole element 110.

The first portion 110a of the first multipole element 110 has a plurality of electrodes and a plurality of magnetic poles arranged regularly around the optical axis OA. In the illustrated example, the first portion 110a has quadrupole electrodes 112a to 112d and quadrupole magnetic poles 114a to 114d arranged around the optical axis OA.

The quadrupole electrodes 112a to 112d are disposed so as to be distributed every 90° on a plane (an XY plane) which is perpendicular to the optical axis OA. In addition, absolute values of applied voltages that are respectively applied to the quadrupole electrodes 112a to 112d are equal to one another. However, in the quadrupole electrodes 112a to 112d, electrodes adjacent to one another around the optical axis OA have reverse polarities. The quadrupole electrodes 112a to 112d generate an electric field having two-fold symmetry.

The quadrupole magnetic poles 114a to 114d are disposed so as to be distributed every 90° on the plane (the XY plane) which is perpendicular to the optical axis OA. In the magnetic pole 114a, an exciting coil (not illustrated) with N-number of turns is mounted on a rear end portion (not illustrated) of the magnetic pole 114a and configured such that an electric current I flows through the exciting coil. Accordingly, the magnetic pole 114a has a magnetomotive force of NI. The magnetic poles 114b, 114c, and 114d are mounted with exciting coils in a similar manner to the magnetic pole 114a. The exciting coils mounted on the quadrupole magnetic poles 114a to 114d are individually connected to a corresponding current source (not illustrated) and magnetomotive forces of the magnetic poles can be set to arbitrary values. In the illustrated example, the magnetomotive forces of the quadrupole magnetic poles 114a to 114d are equal to one another. However, in the quadrupole magnetic poles 114a to 114d, magnetic poles adjacent to one another around the optical axis OA have reverse polarities. The quadrupole magnetic poles 114a to 114d generate a magnetic field having two-fold symmetry.

Figure 3:
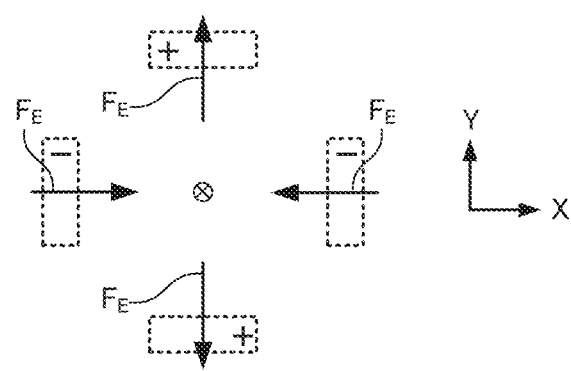
FIG. 3 is a diagram illustrating forces that an electron beam receives from an electric field having two-fold symmetry generated by a quadrupole electrode.

FIG. 3 is a diagram illustrating forces that an electron beam receives from the electric field having two-fold symmetry generated by the quadrupole electrodes 112a to 112d.

As illustrated in FIG. 3, the electric field having two-fold symmetry generated by the quadrupole electrodes 112a to 112d causes the electron beam to converge in the X direction and to diverge in the Y direction. Accordingly, by receiving a force $F_E$ from the electric field having two-fold symmetry, the electron beam converges in the X direction and diverges in the Y direction.

Figure 4:
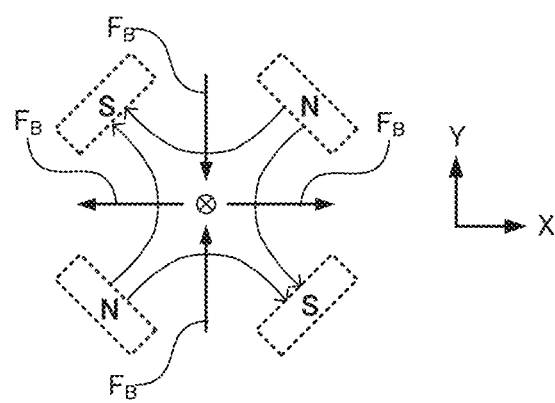
FIG. 4 is a diagram illustrating forces that an electron beam receives from a magnetic field having two-fold symmetry generated by a quadrupole magnetic pole.

FIG. 4 is a diagram illustrating forces that an electron beam receives from the magnetic field having two-fold symmetry generated by the quadrupole magnetic poles 114a to 114d.

As illustrated in FIG. 4, the magnetic field having two-fold symmetry generated by the quadrupole magnetic poles 114a to 114d causes the electron beam to diverge in the X direction and to converge in the Y direction. Accordingly, by receiving a force $F_B$ from the magnetic field having two-fold symmetry, the electron beam diverges in the X direction and converges in the Y direction.

In the first portion 110a, the electromagnetic field having two-fold symmetry is generated by superimposing an electric field having two-fold symmetry and a magnetic field having two-fold symmetry with one another. In the first portion 110a, the force $F_E$ which the electron beam receives from the electric field having two-fold symmetry and the force $F_B$ which the electron beam receives from the magnetic field having two-fold symmetry are applied in mutually canceling directions.

In this case, in the first portion 110a, the electric field having two-fold symmetry is set stronger than the magnetic field having two-fold symmetry. In other words, in the first portion 110a, the force $F_E$ received by the electron beam from the electric field having two-fold symmetry is set greater than the force $F_B$ received by the electron beam from the magnetic field having two-fold symmetry ($F_B < F_E$). Accordingly, the electron beam is imparted with two-fold astigmatism components and an orbit of the electron beam is changed. For example, as illustrated in FIG. 1, the first portion 110a imparts a two-fold astigmatism divergent component to the Y orbit of the electron beam and imparts a two-fold astigmatism convergent component to the X orbit of the electron beam.

In addition, the first portion 110a has a thickness in a direction of travel of the electron beam. More specifically, the first portion 110a has a thickness that enables a combination aberration to be generated by fields of higher-order terms other than a primary term of a multipole field. Therefore, a negative chromatic aberration is generated in the first portion 110a due to the combination aberration. Furthermore, the first portion 110a subjects the electron beam to a concave lens action due to the combination aberration. In other words, the first portion 110a has a concave lens action with respect to the electron beam.

When a point of incidence of an aberration (an aberration 1) generated at a given location varies after propagating a certain distance and the aberration 1 is then affected by another aberration (an aberration 2), a combination aberration is created by a combination of the aberrations 1 and 2. A principle related to the creation of a concave lens effect due to a combination aberration of a two-fold symmetric field having a thickness in the direction of travel of an electron beam is described in JP-A-2014-116219.

Next, the second portion 110b of the first multipole element 110 will be described. The second portion 110b is similar in configuration to the first portion 110a illustrated in FIG. 2. In other words, the second portion 110b of the first multipole element 110 has quadrupole electrodes 112a to 112d and quadrupole magnetic poles 114a to 114d arranged around the optical axis OA.

In the second portion 110b, the magnetic field having two-fold symmetry is set stronger than the electric field having two-fold symmetry. In other words, in the second portion 110b, the force $F_B$ received by an electron beam from the magnetic field having two-fold symmetry is set greater than the force $F_E$ received by the electron beam from the electric field having two-fold symmetry ($F_E < F_B$). Accordingly, the second portion 110b generates a two-fold astigmatism component that is opposite in sign to the two-fold astigmatism component generated in the first portion 110a. In other words, in the second portion 110b, the electron beam is imparted with a two-fold symmetric field which is oriented in an opposite direction to the two-fold symmetric field imparted in the first portion 110a. For example, as illustrated in FIG. 1, the second portion 110b generates a two-fold symmetric field which imparts a two-fold astigmatism convergent component to the Y orbit of the electron beam and imparts a two-fold astigmatism divergent component to the X orbit of the electron beam. Accordingly, the second portion 110b pushes back the Y orbit having a divergent component to reduce the two-fold astigmatism component and, at the same time, weakens the two-fold astigmatism convergent component of the X orbit.

In addition, the second portion 110b has a thickness in the direction of travel of the electron beam in a similar manner to the first portion 110a. Therefore, a negative chromatic aberration is generated in the second portion 110b due to a combination aberration. Furthermore, the second portion 110b subjects the electron beam to a convex lens action due to the combination aberration. In other words, the second portion 110b has a convex lens action with respect to the electron beam.

Next, the third portion 110c of the first multipole element 110 will be described. The third portion 110c is similar in configuration to the first portion 110a illustrated in FIG. 2. In other words, the third portion 110c of the first multipole element 110 has quadrupole electrodes 112a to 112d and quadrupole magnetic poles 114a to 114d arranged around the optical axis OA.

In the third portion 110c, the electric field having two-fold symmetry is set stronger than the magnetic field having two-fold symmetry in a similar manner to the first portion 110a. In other words, in the third portion 110c, the force $F_E$ received by an electron beam from the electric field having two-fold symmetry is set greater than the force $F_B$ received by the electron beam from the magnetic field having two-fold symmetry ($F_B<F_E$). Accordingly, the third portion 110c imparts the electron beam with two-fold astigmatism components and changes an orbit of the electron beam in a similar manner to the first portion 110a. For example, as illustrated in FIG. 1, the third portion 110c imparts a two-fold astigmatism divergent component to the Y orbit of the electron beam and imparts a two-fold astigmatism convergent component to the X orbit of the electron beam. Accordingly, the two-fold astigmatism components of the electron beam emitted from the first multipole element 110 can be eliminated (reduced).

In addition, the third portion 110c has a thickness in the direction of travel of the electron beam in a similar manner to the first portion 110a. Therefore, a negative chromatic aberration is generated in the third portion 110c due to a combination aberration. Furthermore, the third portion 110c subjects the electron beam to a concave lens action due to the combination aberration. In other words, the third portion 110c has a concave lens action with respect to the electron beam.

In the first multipole element 110, the two-fold astigmatism components of the electromagnetic fields having two-fold symmetry which are generated in the first portion 110a and the third portion 110c are opposite in sign to the two-fold astigmatism component of the electromagnetic field having two-fold symmetry which is generated in the second portion 110b. In addition, the action imparted to the electron beam by the electromagnetic field having two-fold symmetry of the first portion 110a is the same as the action imparted to the electron beam by the electromagnetic field having two-fold symmetry of the third portion 110c.

In the first multipole element 110, the X orbit of the electron beam intersects the optical axis OA at a center C of the first multipole element 110. Furthermore, in the first multipole element 110, relative to the center C as a point of symmetry, a former portion (an orbit from an incidence plane to the center C) and a latter portion (an orbit from the center C to an exit plane) of the X orbit of the electron beam are point symmetric to one another. In addition, in the first multipole element 110, a former portion (an orbit from the incidence plane to the center C) and a latter portion (an orbit from the center C to the exit plane) of the Y orbit of the electron beam are plane symmetric. In this manner, in the first multipole element 110, the orbit of the electron beam has good symmetry.

Furthermore, in the first multipole element 110, after the X orbit and the Y orbit of the electron beam are changed significantly in the first portion 110a, the orbits are restored to their original states in the second portion 110b and, finally, the two-fold astigmatism components are canceled out in the third portion 110c and the electron beam is emitted. Since the X orbit and the Y orbit of the electron beam are changed significantly in the first multipole element 110 in this manner, a chromatic aberration can be generated at high efficiency.

The second multipole element 120 generates a second electromagnetic field that corresponds to a 90° rotation of the first electromagnetic field around the optical axis OA. In other words, in the second multipole element 120, the electric and magnetic fields are set such that an X orbit and a Y orbit are symmetrical with respect to the first multipole element 110 as illustrated in FIG. 1. Accordingly, a two-fold chromatic astigmatism component generated in the first multipole element 110 can be canceled out by a two-fold chromatic astigmatism component generated in the second multipole element 120. Therefore, two-fold chromatic aberration components can be eliminated in the chromatic aberration corrector 100 as a whole.

The second multipole element 120 is divided into three portions (a first portion 120a, a second portion 120b, and a third portion 120c). In the second multipole element 120, the first portion 120a, the second portion 120b, and the third portion 120c are disposed in this order in the direction of travel of an electron beam. The first portion 120a, the second portion 120b, and the third portion 120c are disposed along the optical axis OA.

The second multipole element 120 generates a second electromagnetic field. Each of the three portions 120a, 120b, and 120c of the second multipole element 120 generates an electromagnetic field having two-fold symmetry (a quadrupole field of superimposed electric and magnetic fields) in which an electric field having two-fold symmetry (an electric quadrupole field) and a magnetic field having two-fold symmetry (a magnetic quadrupole field) are superimposed. The second electromagnetic field is formed by the electromagnetic fields having two-fold symmetry respectively generated by the three portions 120a, 120b, and 120c of the second multipole element 120.

Hereinafter, the three portions 120a, 120b, and 120c of the second multipole element 120 will be described in detail.

Figure 5:
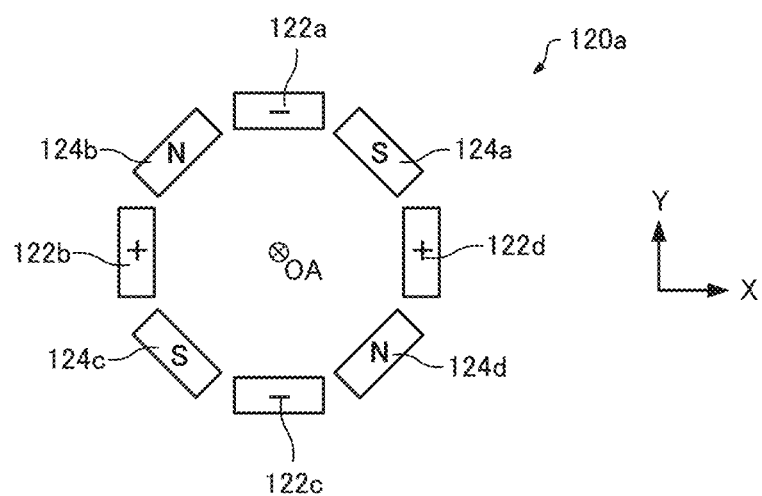
FIG. 5 is a plan view schematically illustrating a first portion of a second multipole element.

First, the first portion 120a of the second multipole element 120 will be described. FIG. 5 is a plan view schematically illustrating the first portion 120a of the second multipole element 120.

The first portion 120a of the second multipole element 120 has a plurality of electrodes and a plurality of magnetic poles arranged regularly around the optical axis OA. In the illustrated example, the first portion 120a has quadrupole electrodes 122a to 122d and quadrupole magnetic poles 124a to 124d arranged around the optical axis OA.

As illustrated in FIG. 5, the quadrupole electrodes 122a to 122d and the quadrupole magnetic poles 124a to 124d of the first portion 120a of the second multipole element 120 are similar in physical arrangement but opposite in polarity to the first portion 110a (refer to FIG. 2) of the first multipole element 110. In other words, the polarity of the first portion 120a of the second multipole element 120 is rotated by 90° relative to the polarity of the first portion 110a of the first multipole element 110.

In the first portion 120a, the electric field having two-fold symmetry is set stronger than the magnetic field having two-fold symmetry. In other words, in the first portion 120a, the force $F_E$ received by an electron beam from the electric field having two-fold symmetry is set greater than the force $F_B$ received by the electron beam from the magnetic field having two-fold symmetry ($F_B<F_E$). Accordingly, the electron beam is imparted with two-fold astigmatism components and an orbit of the electron beam is changed. For example, as illustrated in FIG. 1, the first portion 120a imparts a two-fold astigmatism divergent component to the X orbit of the electron beam and imparts a two-fold astigmatism convergent component to the Y orbit of the electron beam. The electromagnetic field having two-fold symmetry generated by the first portion 120a of the second multipole element 120 is a field that corresponds to a 90° rotation around the optical axis OA of the electromagnetic field having two-fold symmetry generated by the first portion 110a of the first multipole element 110.

In addition, the first portion 120a has a thickness in a direction of travel of the electron beam. Therefore, a negative chromatic aberration is generated in the first portion 120a due to a combination aberration. Furthermore, the first portion 120a subjects the electron beam to a concave lens action due to the combination aberration.

Next, the second portion 120b of the second multipole element 120 will be described. The second portion 120b is similar in configuration to the first portion 120a illustrated in FIG. 5. In other words, the second portion 120b of the second multipole element 120 has quadrupole electrodes 122a to 122d and quadrupole magnetic poles 124a to 124d arranged around the optical axis OA.

In the second portion 120b, the magnetic field having two-fold symmetry is set stronger than the electric field having two-fold symmetry. In other words, in the second portion 120b, the force $F_B$ received by an electron beam from the magnetic field having two-fold symmetry is set greater than the force $F_E$ received by the electron beam from the electric field having two-fold symmetry ($F_E < F_B$). Accordingly, the second portion 120b generates a two-fold astigmatism component that is opposite in sign to the two-fold astigmatism component generated in the first portion 120a. In the second portion 120b, the electron beam is imparted with an electromagnetic field having two-fold symmetry which is oriented in an opposite direction to the field imparted in the first portion 120a.

For example, as illustrated in FIG. 1, the second portion 120b generates an electromagnetic field having two-fold symmetry which imparts a two-fold astigmatism convergent component to the X orbit of the electron beam and imparts a two-fold astigmatism divergent component to the Y orbit of the electron beam. Accordingly, the second portion 120b pushes back the X orbit having a divergent component to reduce the two-fold astigmatism component and, at the same time, weakens the two-fold astigmatism convergent component of the Y orbit. The electromagnetic field having two-fold symmetry generated by the second portion 120b is a field that corresponds to a 90° rotation around the optical axis OA of the electromagnetic field having two-fold symmetry generated by the second portion 110b of the first multipole element 110.

In addition, the second portion 120b has a thickness in the direction of travel of the electron beam in a similar manner to the first portion 120a. Therefore, a negative chromatic aberration is generated in the second portion 120b due to a combination aberration. Furthermore, the second portion 120b subjects the electron beam to a convex lens action due to the combination aberration.

Next, the third portion 120c of the second multipole element 120 will be described. The third portion 120c is similar in configuration to the first portion 120a illustrated in FIG. 5. In other words, the third portion 120c of the second multipole element 120 has quadrupole electrodes 122a to 122d and quadrupole magnetic poles 124a to 124d arranged around the optical axis OA.

In the third portion 120c, the electric field having two-fold symmetry is set stronger than the magnetic field having two-fold symmetry in a similar manner to the first portion 120a. In other words, in the third portion 120c, the force $F_E$ received by an electron beam from the electric field having two-fold symmetry is set greater than the force $F_B$ received by the electron beam from the magnetic field having two-fold symmetry ($F_B < F_E$). Accordingly, the third portion 120c imparts the electron beam with two-fold astigmatism components and changes an orbit of the electron beam in a similar manner to the first portion 120a. For example, the third portion 120c imparts a two-fold astigmatism divergent component to the X orbit of the electron beam and imparts a two-fold astigmatism convergent component to the Y orbit of the electron beam. Accordingly, the two-fold astigmatism components of the electron beam emitted from the second multipole element 120 can be eliminated (reduced). The electromagnetic field having two-fold symmetry generated by the third portion 120c of the second multipole element 120 is a field that corresponds to a 90° rotation around the optical axis OA of the electromagnetic field having two-fold symmetry generated by the third portion 110c of the first multipole element 110.

In addition, the third portion 120c has a thickness in the direction of travel of the electron beam in a similar manner to the first portion 120a. Therefore, a negative chromatic aberration is generated in the third portion 120c due to a combination aberration. Furthermore, the third portion 120c subjects the electron beam to a concave lens action due to the combination aberration.

In the second multipole element 120, the two-fold astigmatism components of the electromagnetic fields having two-fold symmetry which are generated in the first portion 120a and the third portion 120c are opposite in sign to the two-fold astigmatism component of the electromagnetic field having two-fold symmetry which is generated in the second portion 120b. The action imparted to the electron beam by the electromagnetic field having two-fold symmetry of the first portion 120a is the same as the action imparted to the electron beam by the electromagnetic field having two-fold symmetry of the third portion 120c.

As illustrated in FIG. 1, in the second multipole element 120, the Y orbit of the electron beam intersects the optical axis OA at a center C of the second multipole element 120. In addition, in the second multipole element 120, relative to the center C as a point of symmetry, a former portion (an orbit from an incidence plane to the center C) and a latter portion (an orbit from the center C to an exit plane) of the Y orbit of the electron beam are point symmetric to one another. Furthermore, in the second multipole element 120, a former portion (an orbit from the incidence plane to the center C) and a latter portion (an orbit from the center C to the exit plane) of the X orbit of the electron beam are plane symmetric. In this manner, in the second multipole element 120, the orbit of the electron beam has good symmetry.

In addition, in the second multipole element 120, after the X orbit and the Y orbit of the electron beam are changed significantly in the first portion 120a, the orbits are restored to their original states in the second portion 120b and, finally, the two-fold astigmatism components are canceled out in the third portion 120c and the electron beam is emitted in a similar manner to the first multipole element 110. Since the X orbit and the Y orbit of the electron beam are changed significantly in the second multipole element 120 in this manner, a chromatic aberration can be generated at high efficiency.

Figure 6:
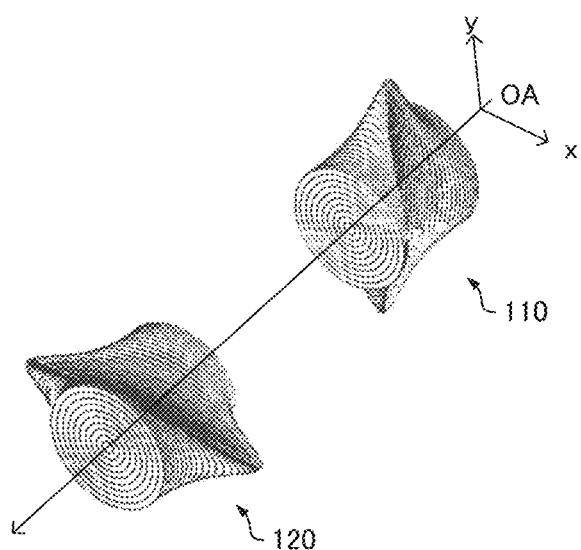
FIG. 6 is a schematic view illustrating an orbit of an electron beam inside a first multipole element and a second multipole element of a chromatic aberration corrector.

FIG. 6 is a schematic diagram illustrating an orbit of an electron beam inside the first multipole element 110 and the second multipole element 120 of the chromatic aberration corrector 100. In FIG. 6, each circle indicates an orbit of the electron beam in each angular range (for every 10 mrad).

In the first portion 110a of the first multipole element 110, the electric field having two-fold symmetry is set stronger than the magnetic field having two-fold symmetry. Accordingly, an electron beam incident to the first portion 110a has two-fold astigmatism components and an orbit of the electron beam is changed. Specifically, in the first portion 110a, the Y orbit of the electron beam has a two-fold astigmatism divergent component and the X orbit of the electron beam has a two-fold astigmatism convergent component.

In the second portion 110b, the magnetic field having two-fold symmetry is set stronger than the electric field having two-fold symmetry. Accordingly, in the second portion 110b, the Y orbit having a divergent component is pushed back and the two-fold astigmatism component decreases. In addition, the convergent component of the two-fold astigmatism of the X orbit weakens and the X orbit passes through the center C of the first multipole element 110. In the X orbit, an orbit on a +X axis side and an orbit on a −X axis side intersect at the center C of the first multipole element 110.

In the third portion 110c, the electric field having two-fold symmetry is set stronger than the magnetic field having two-fold symmetry. Accordingly, in the third portion 110c, the two-fold astigmatism components of the electron beam are finally canceled out. Therefore, the electron beam emitted from the third portion 110c (the first multipole element 110) is devoid of two-fold astigmatism components.

In the second multipole element 120, an electromagnetic field is generated which causes the X orbit and the Y orbit of an electron beam to be symmetrical to the X orbit and the Y orbit of an electron beam in the first multipole element 110. In other words, the electromagnetic field generated by the second multipole element 120 is an electromagnetic field corresponding to a 90° rotation around the optical axis OA of the electromagnetic field generated by the first multipole element 110. Accordingly, in the second multipole element 120, the two-fold chromatic astigmatism components generated in the first multipole element 110 are canceled out by the two-fold chromatic astigmatism components generated in the second multipole element 120. The orbit of the electron beam in the second multipole element 120 corresponds to a 90° rotation around the optical axis OA of the orbit of the electron beam in the first multipole element 110.

Negative chromatic aberrations are generated in the respective portions 110a, 110b, 110c, 120a, 120b, and 120c of the multipole elements 110 and 120 due to combination aberrations. Therefore, in the chromatic aberration corrector 100, a negative chromatic aberration is generated as a whole. Accordingly, a positive chromatic aberration of an objective lens, a condenser lens, or the like can be canceled out by the negative chromatic aberration of the chromatic aberration corrector 100.

As described earlier, the chromatic aberration corrector 100 is capable of correcting a chromatic aberration using the first multipole element 110 and the second multipole element 120. In addition, the chromatic aberration corrector 100 also functions as a transfer lens system.

Figure 7:
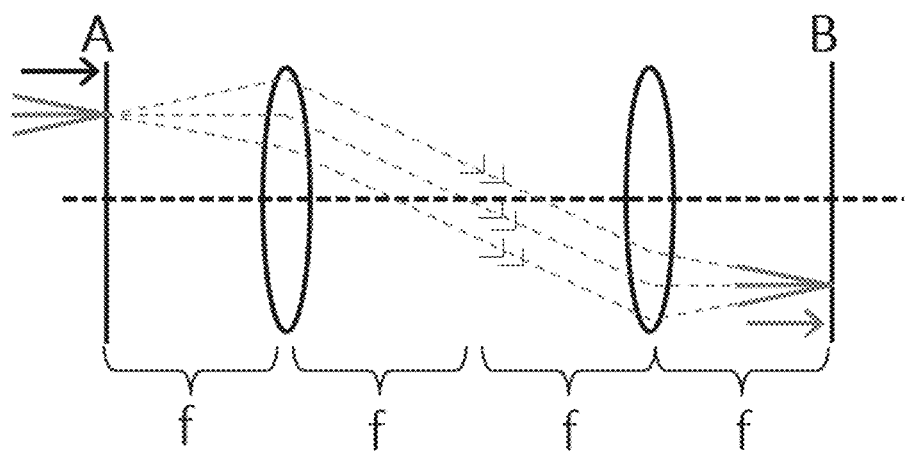
FIG. 7 is a diagram schematically illustrating a transfer lens pair used in a two-stage hexapole spherical aberration corrector.

FIG. 7 is a diagram schematically illustrating a transfer lens pair used in a two-stage hexapole spherical aberration corrector. The transfer lens pair used in the spherical aberration corrector is configured as a complete-transfer optical system which is capable of transferring a position and an angle of an electron beam on an optical plane A to an optical plane B.

Figure 8:
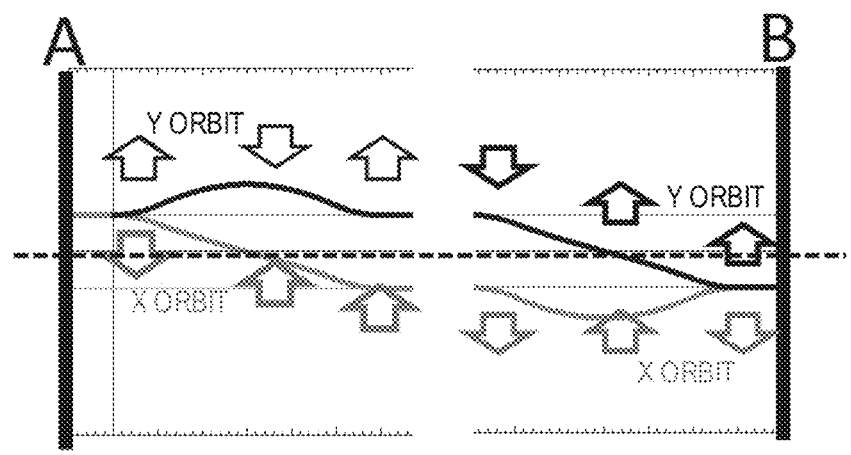
FIG. 8 is a diagram illustrating an electron orbit in a chromatic aberration corrector.
Figure 9:
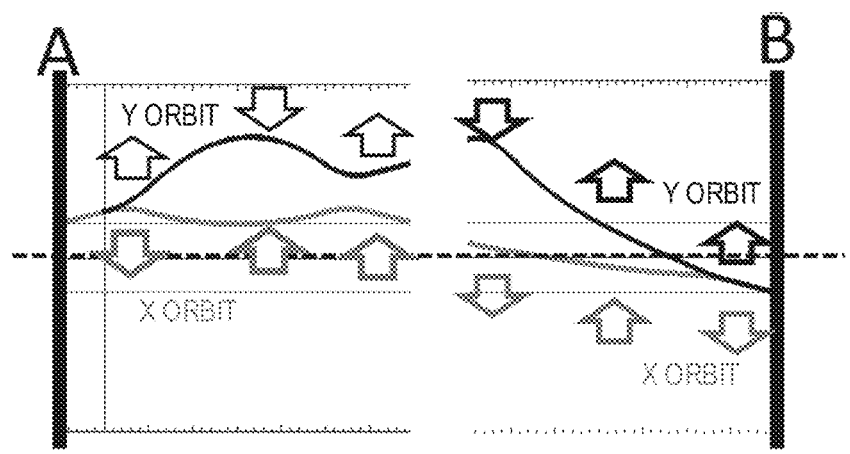
FIG. 9 is a diagram illustrating an electron orbit in a chromatic aberration corrector.

FIGS. 8 and 9 are diagrams illustrating an electron orbit (an X orbit and a Y orbit) in the chromatic aberration corrector 100. FIG. 8 represents a result of a calculation of an orbit of an electron beam when the electron beam is perpendicularly incident to the optical plane A (parallel to the optical axis OA). FIG. 9 represents a result of a calculation of an orbit of an electron beam when the electron beam is incident at a certain angle to the optical plane A.

In FIGS. 8 and 9, a length a of the first portion 110a and the third portion 120c, a length b of the second portion 110b and the second portion 120b, a length c of the third portion 110c and the first portion 120a, a distance $D_0$ between the optical plane A and the first multipole element 110, a distance $D_2$ between the optical plane B and the second multipole element 120, and a distance $D_1$ between the first multipole element 110 and the second multipole element 120, all illustrated in FIG. 1, have been optimized. In addition, the magnetic fields and the electric fields generated in the respective portions 110a, 110b, and 110c of the first multipole element 110 and the respective portions 120a, 120b, and 120c of the second multipole element 120 have been optimized.

As illustrated in FIG. 8, an electron beam perpendicularly incident to the optical plane A is transferred by the first multipole element 110 and the second multipole element 120 to a same position on the optical plane B so as to be perpendicularly incident to the optical plane B.

As illustrated in FIG. 9, an electron beam incident at a certain angle to the optical plane A is transferred by the first multipole element 110 and the second multipole element 120 to the optical plane B so that a position and an angle of the electron beam are retained.

As described above, the chromatic aberration corrector 100 is capable of performing a complete transfer in which a position and an angle of an electron beam are transferred to the optical planes A and B. In other words, the chromatic aberration corrector 100 is capable of correcting a chromatic aberration and, at the same time, the chromatic aberration corrector 100 can be used as a transfer lens system of a geometric aberration corrector.

2. Modification of Chromatic Aberration Corrector

Figure 10:
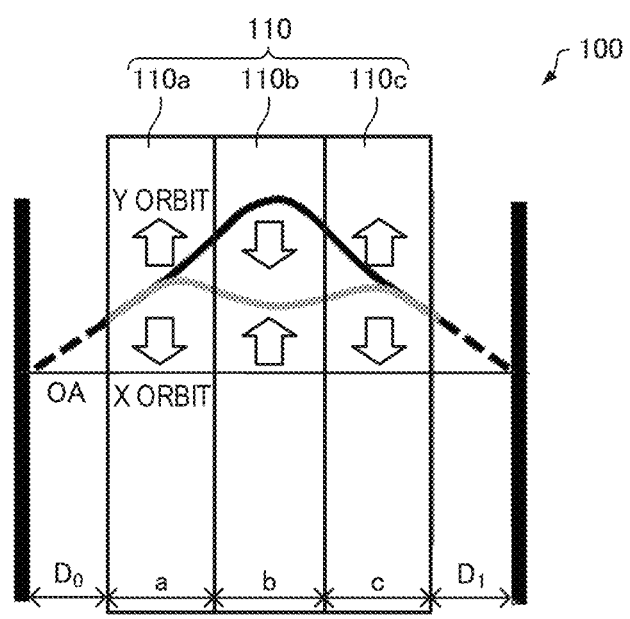
FIG. 10 is a diagram illustrating a modification of an optical system of a chromatic aberration corrector.

Next, a modification of the chromatic aberration corrector used in the aberration corrector according to the above embodiment of the invention will be described with reference to the drawings. FIG. 10 is a diagram illustrating a modification of the optical system of the chromatic aberration corrector 100 used in the aberration corrector according to the embodiment of the invention. In FIG. 10, the chromatic aberration corrector 100 is disposed between the optical plane A and the optical plane B.

In the chromatic aberration corrector 100 illustrated in FIG. 1 and described above, a transfer lens system is realized by multipole elements (the first multipole element 110 and the second multipole element 120) in two stages.

In contrast, in this modification, the transfer lens system is realized by a single multipole element (the first multipole element 110) as illustrated in FIG. 10.

In FIG. 10, a length a of the first portion 110a, a length b of the second portion 110b, and a length c of the third portion 110c of the first multipole element 110, a distance $D_0$ between the optical plane A and the first multipole element 110, and a distance $D_1$ between the optical plane B and the first multipole element 110 have been optimized. In addition, the magnetic fields and the electric fields generated in the respective portions 110a, 110b, and 110c of the first multipole element 110 have been optimized.

Figure 11:
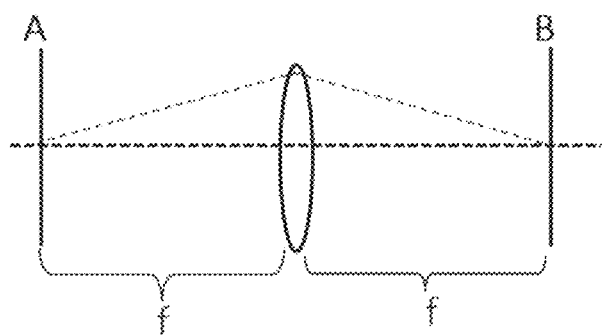
FIG. 11 is a diagram schematically illustrating a lens.
Figure 12:
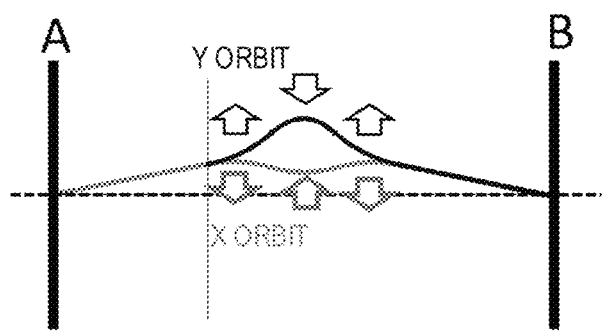
FIG. 12 is a diagram illustrating a calculation result of an electron orbit in a chromatic aberration corrector.

FIG. 11 is a diagram schematically illustrating a lens. In FIG. 11, the lens is configured as an optical system having the optical plane A and the optical plane B as an image plane and an object plane. FIG. 12 is a diagram illustrating a result of a calculation of an electron orbit (an X orbit and a Y orbit) in the chromatic aberration corrector 100.

As illustrated in FIG. 12, by having the first multipole element 110 generate two-fold symmetric fields in three stages, an optical system capable of focusing on the optical plane A and the optical plane B with the lens can be constructed. By providing two of these optical systems and using an electromagnetic field having two-fold symmetry as a two-fold symmetric field, a negative chromatic aberration can be generated and chromatic aberration correction can be performed.

Moreover, the complete-transfer optical system illustrated in FIG. 7 can be constructed by disposing the first multipole element 110 illustrated in FIG. 10 in two stages.

3. Aberration Corrector

3.1. First Embodiment

Figure 13:
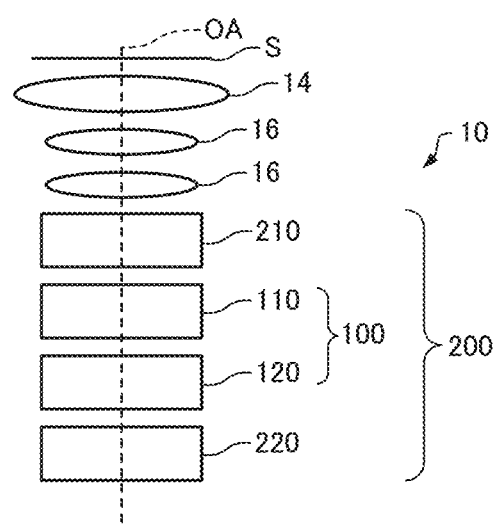
FIG. 13 is a diagram illustrating an optical system of an aberration corrector according to the first embodiment of the invention.
Figure 14:
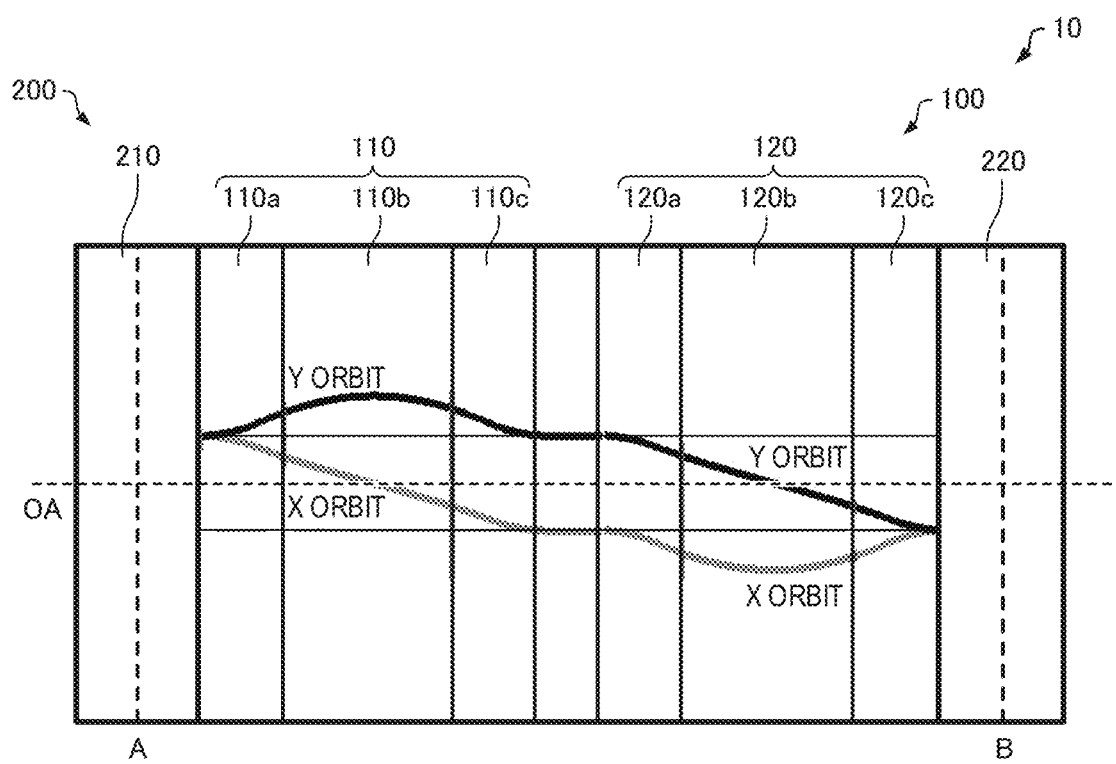
FIG. 14 is a diagram illustrating an electron orbit in the aberration corrector according to the first embodiment.

Next, an aberration corrector according to a first embodiment of the invention will be described with reference to the drawings. FIG. 13 is a diagram illustrating an optical system of an aberration corrector 10 according to the first embodiment. FIG. 14 is a diagram illustrating an electron orbit (an X orbit and a Y orbit) in the aberration corrector 10.

The aberration corrector 10 is an aberration corrector to be used with an electron microscope. In other words, the aberration corrector 10 is mounted to an electron microscope. The aberration corrector 10 is built into an imaging system of an electron microscope as illustrated in FIG. 13. Alternatively, as will be described later, the aberration corrector 10 may be built into an illumination system of the electron microscope. In the illustrated example, the aberration corrector 10 is disposed in a subsequent stage to an objective lens 14. Two transfer lenses 16 are disposed between the objective lens 14 and the aberration corrector 10.

The aberration corrector 10 includes a geometric aberration corrector 200. The geometric aberration corrector 200 has multipole elements for geometric aberration correction (a first multipole element 210 and a second multipole element 220) in two stages and a chromatic aberration corrector 100 as a transfer lens system.

The first multipole element 210 in a front stage and the second multipole element 220 in a rear stage are disposed along an optical axis OA. In the geometric aberration corrector 200, aberration correction is performed by utilizing a phenomenon in which a thickness along a direction of travel of an electron beam or, in other words, a three-fold symmetric field (an electric field having three-fold symmetry or a magnetic field having three-fold symmetry, a hexapole field) having a thickness along the optical axis OA generates a negative spherical aberration.

The geometric aberration corrector 200 corrects a spherical aberration of the objective lens 14 by generating three-fold symmetric fields in two stages with the multipole elements (the first multipole element 210 and the second multipole element 220) in two stages. The three-fold symmetric field generated by the first multipole element 210 and the three-fold symmetric field generated by the second multipole element 220 are opposite in polarity.

The first multipole element 210 and the second multipole element 220 are, for example, hexapole elements or dodecapole elements. Note that the first multipole element 210 and the second multipole element 220 need only be capable of generating three-fold symmetric fields and are not limited to hexapole elements or dodecapole elements.

The chromatic aberration corrector 100 which functions as a transfer lens system is disposed between the first multipole element 210 and the second multipole element 220. In other words, in the aberration corrector 10, the chromatic aberration corrector 100 functions as the transfer lens system of the geometric aberration corrector 200 but also has a function of correcting a chromatic aberration.

The chromatic aberration corrector 100 as the transfer lens system transfers an image equivalent to an image obtained by the first multipole element 210 to the second multipole element 220. Accordingly, an optical distance between the first multipole element 210 and the second multipole element 220 becomes zero. Therefore, a physical distance can be provided between the first multipole element 210 and the second multipole element 220 and a degree of freedom of dispositions of the first multipole element 210 and the second multipole element 220 can be improved.

Figure 15:
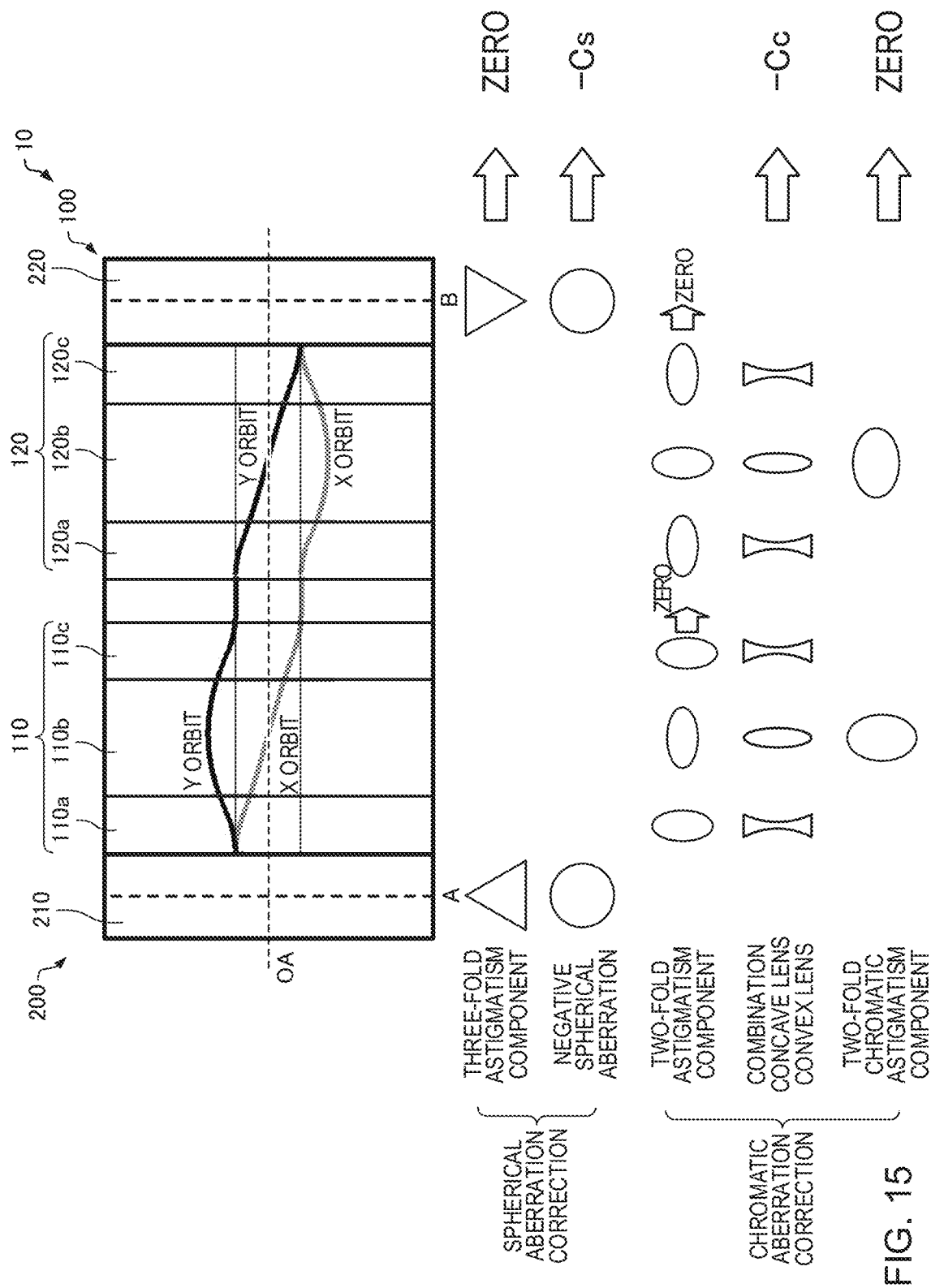
FIG. 15 is a diagram illustrating a function of the optical system of the aberration corrector according to the first embodiment.

FIG. 15 is a diagram illustrating a function of the optical system of the aberration corrector 10.

In the geometric aberration corrector 200, in a first three-fold symmetric field generated by the first multipole element 210, a three-fold astigmatism and a negative spherical aberration are generated. A principal optical plane of the first three-fold symmetric field is transferred to a principal optical plane of the second three-fold symmetric field by the transfer lens system or, in other words, the chromatic aberration corrector 100. The second multipole element 220 generates a second three-fold symmetric field that is opposite in polarity to the three-fold symmetric field generated by the first multipole element 210. Therefore, in the second three-fold symmetric field, a three-fold astigmatism oriented in an opposite direction to the three-fold astigmatism generated in the first three-fold symmetric field and a negative spherical aberration are generated. Due to the first three-fold symmetric field and the second three-fold symmetric field, a positive spherical aberration of the objective lens 14 can be corrected and three-fold astigmatisms can be canceled out.

In the chromatic aberration corrector 100, electromagnetic fields having two-fold symmetry in three stages generated by one multipole element are capable of correcting a chromatic aberration in the X direction or the Y direction depending on how the electromagnetic fields are set. Therefore, in the chromatic aberration corrector 100, by disposing the multipole elements (the first multipole element 110 and the second multipole element 120) in two stages, a chromatic aberration in the X direction and a chromatic aberration in the Y direction can be separately corrected and chromatic aberrations can be uniformly corrected in both the X direction and the Y direction in the system as a whole.

A geometric two-fold symmetric field is not generated at an entrance and an exit of the first multipole element 110 and an entrance and an exit of the second multipole element 120 and two-fold astigmatism components are canceled out inside the respective multipole elements.

In addition, the chromatic aberration of the objective lens 14 can be corrected by a negative chromatic aberration component due to an effect of combination aberrations generated in the first multipole element 110 and the second multipole element 120.

Two-fold chromatic astigmatism components are generated in the first multipole element 110 and the second multipole element 120. The two-fold chromatic astigmatism component generated in the first multipole element 110 and the two-fold chromatic astigmatism component generated in the second multipole element 120 cancel out each other and become zero as a whole.

For example, the aberration corrector 10 has the following features.

The aberration corrector 10 includes the geometric aberration corrector 200 provided with a transfer lens system and the transfer lens system is constituted by the chromatic aberration corrector 100. Therefore, with the aberration corrector 10, a spherical aberration and a chromatic aberration can be corrected. Furthermore, in the aberration corrector 10, for example, an increase in a length of the optical system can be reduced as compared to a case where, for example, a geometric aberration corrector and a chromatic aberration corrector are connected in tandem.

In addition, in the aberration corrector 10, as illustrated in FIG. 15, correction of a spherical aberration is performed by the first multipole element 210 and the second multipole element 220 and correction of a chromatic aberration is performed by the first multipole element 110 and the second multipole element 120. Therefore, with the aberration corrector 10, adjustments for correcting a spherical aberration and a chromatic aberration can be readily performed.

For example, in an aberration corrector which performs correction of a spherical aberration and correction of a chromatic aberration using a same multipole element, changing an orbit of an electron beam for the purpose of varying the spherical aberration also ends up varying the chromatic aberration. In a similar manner, changing the orbit of the electron beam for the purpose of varying the chromatic aberration also ends up varying the spherical aberration. Therefore, with such an aberration corrector, adjustments for correcting a spherical aberration and a chromatic aberration are complicated and time-consuming. In contrast, in the aberration corrector 10, correction of a spherical aberration is performed by the first multipole element 210 and the second multipole element 220 and correction of a chromatic aberration is performed by the first multipole element 110 and the second multipole element 120. Therefore, correction of a spherical aberration and correction of a chromatic aberration can be independently performed and adjustments can be readily made.

In the aberration corrector 10, the chromatic aberration corrector 100 is disposed between the first multipole element 210 and the second multipole element 220. Therefore, in the aberration corrector 10, the chromatic aberration corrector 100 can be used as a transfer lens system and an increase in the length of the optical system can be reduced.

In the aberration corrector 10, the chromatic aberration corrector 100 as the transfer lens system includes multipole elements (the first multipole element 110 and the second multipole element 120) in two stages. In addition, in the first multipole element 110, an electric field having two-fold symmetry is set stronger than a magnetic field having two-fold symmetry in the first portion 110a, a magnetic field having two-fold symmetry is set stronger than an electric field having two-fold symmetry in the second portion 110b, an electric field having two-fold symmetry is set stronger than a magnetic field having two-fold symmetry in the third portion 110c, a two-fold astigmatism component generated in the second portion 110b is opposite in sign to two-fold astigmatism components generated in the first portion 110a and the third portion 110c, and a force received by an electron beam from the electric field having two-fold symmetry and a force received by the electron beam from the magnetic field having two-fold symmetry in each of the first portion 110a, the second portion 110b, and the third portion 110c are applied in mutually canceling directions. Furthermore, a second electromagnetic field generated by the second multipole element 120 is a field corresponding to a 90° rotation around the optical axis of a first electromagnetic field generated by the first multipole element 110. Therefore, in the aberration corrector 10, an increase in the length of the optical system can be reduced and, at the same time, a negative chromatic aberration can be generated in an efficient manner.

3.2. Second Embodiment

Figure 16:
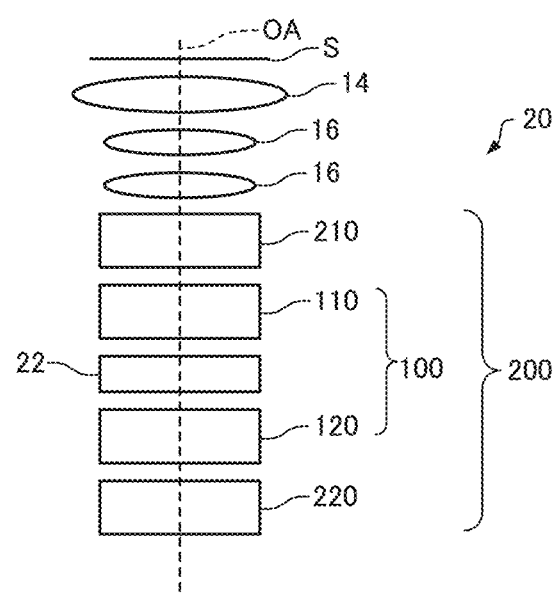
FIG. 16 is a diagram illustrating an optical system of an aberration corrector according to the second embodiment of the invention.
Figure 17:
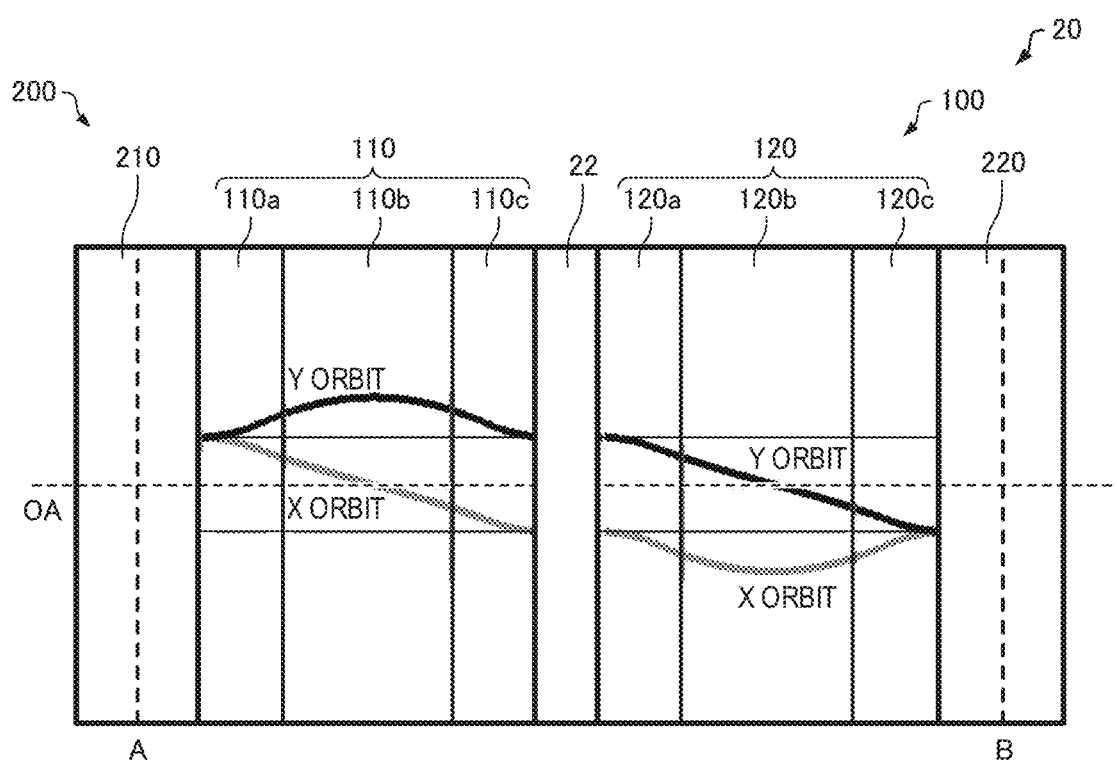
FIG. 17 is a diagram illustrating an electron orbit in the aberration corrector according to the second embodiment.

Next, an aberration corrector according to a second embodiment of the invention will be described with reference to the drawings. FIG. 16 is a diagram illustrating an optical system of an aberration corrector 20 according to the second embodiment. FIG. 17 is a diagram illustrating an electron orbit (an X orbit and a Y orbit) in the aberration corrector 20. Hereinafter, in the aberration corrector 20 according to the second embodiment, members having similar functions to the components of the aberration corrector 10 according to the first embodiment will be denoted by same reference characters and a detailed description thereof will be omitted.

As illustrated in FIG. 16, the aberration corrector 20 includes a multipole element 22 as an optical system for higher-order aberration correction which is disposed between the first multipole element 110 and the second multipole element 120. The multipole element 22 corrects higher-order aberrations (for example, four-fold astigmatisms) generated by a first electromagnetic field generated by the first multipole element 110 and a second electromagnetic field generated by the second multipole element 120. Furthermore, the multipole element 22 corrects a higher-order aberration generated by a three-fold symmetric field generated by the geometric aberration corrector 200. Note that the multipole element 22 need only correct at least one of the higher-order aberrations generated by the first electromagnetic field and the second electromagnetic field and the higher-order aberration generated by the three-fold symmetric field generated by the geometric aberration corrector 200.

In this case, in the chromatic aberration corrector 100, the X orbit and the Y orbit of an electron beam are point-symmetric orbits having a point of symmetry between the first multipole element 110 and the second multipole element 120. In the aberration corrector 20, the multipole element 22 is disposed at a position of the point of symmetry. In this manner, in the aberration corrector 20, the multipole element 22 can be disposed at a preferable position for correcting higher-order aberrations generated by the first multipole element 110 and the second multipole element 120.

Figure 18:
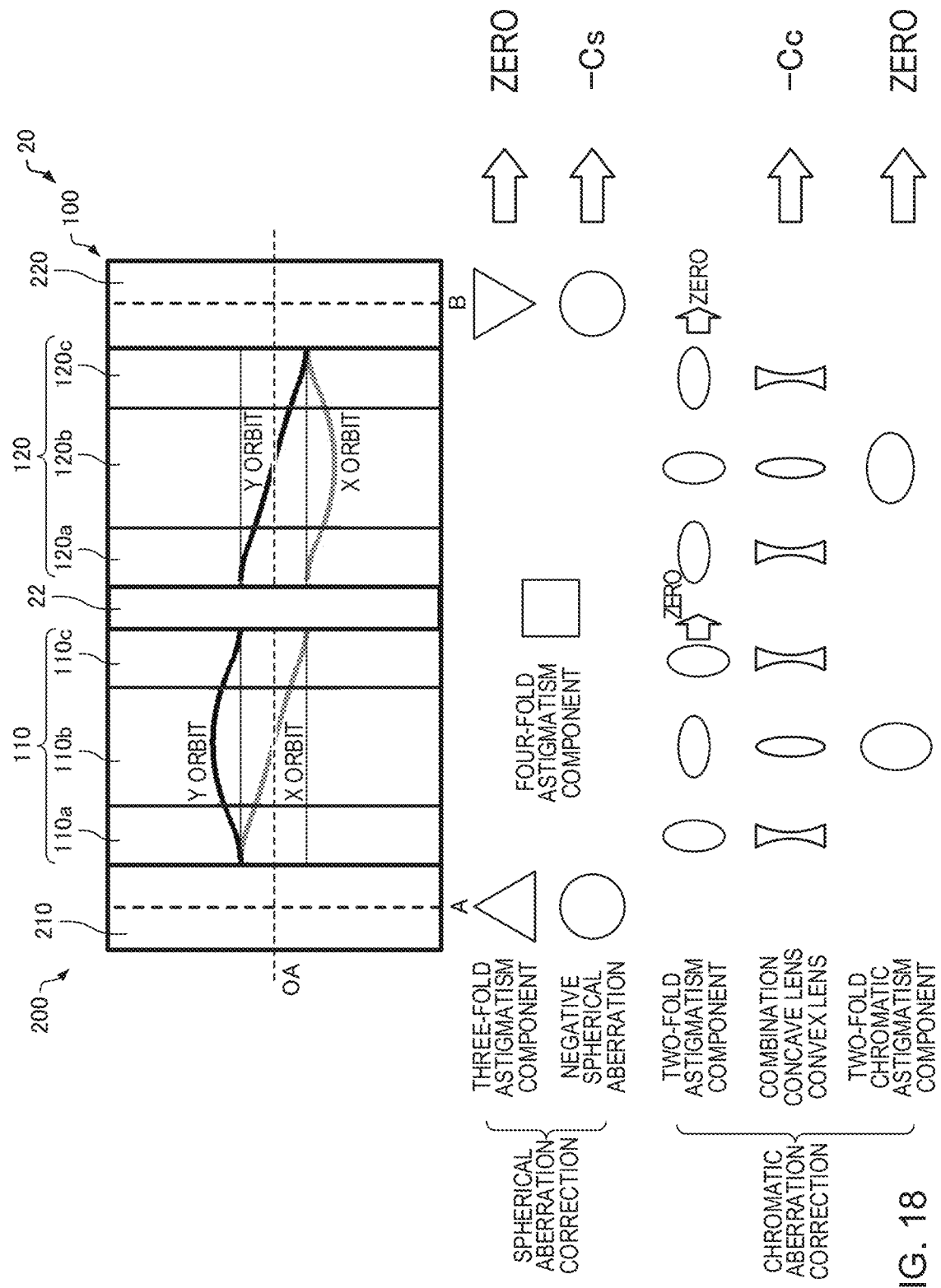
FIG. 18 is a diagram illustrating a function of the optical system of the aberration corrector according to the second embodiment.

FIG. 18 is a diagram illustrating a function of the optical system of the aberration corrector 20.

Functions of the geometric aberration corrector 200 and the chromatic aberration corrector 100 are similar to those of the aberration corrector 10 described earlier and a description thereof will be omitted.

In the aberration corrector 20, a higher-order aberration generated when the first multipole element 110 and the second multipole element 120 generate an electromagnetic field having two-fold symmetry or, in other words, a four-fold astigmatism can be corrected by the multipole element 22.

In addition, in the aberration corrector 20, a higher-order aberration generated when the first multipole element 210 and the second multipole element 220 generate three-fold symmetric fields can be corrected by the multipole element 22.

For example, the aberration corrector 20 has the following features.

The aberration corrector 20 includes the multipole element 22 disposed between the first multipole element 110 and the second multipole element 120 and the multipole element 22 corrects higher-order aberrations generated by the first electromagnetic field generated by the first multipole element 110 and the second electromagnetic field generated by the second multipole element 120. Therefore, in the aberration corrector 20, a higher-order aberration (a four-fold astigmatism) generated by the chromatic aberration corrector 100 can be corrected.

In addition, in the aberration corrector 20, a higher-order aberration generated by the geometric aberration corrector 200 is corrected. Therefore, in the aberration corrector 20, a higher-order aberration generated by the geometric aberration corrector 200 can be corrected.

3.3. Third Embodiment

Figure 19:
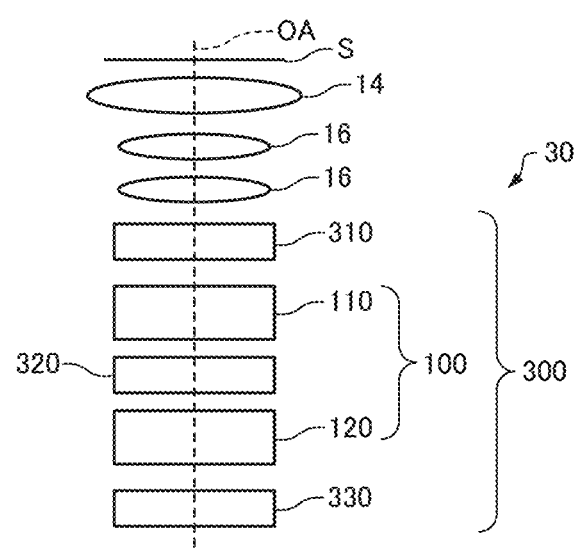
FIG. 19 is a diagram illustrating an optical system of an aberration corrector according to the third embodiment of the invention.
Figure 20:
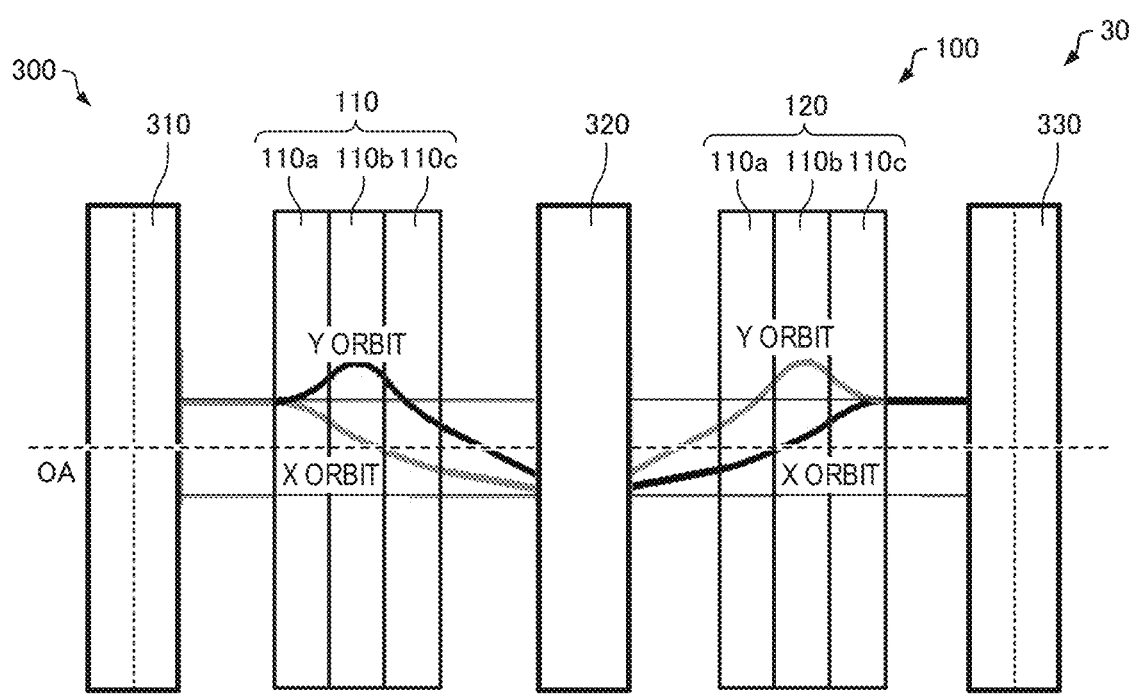
FIG. 20 is a diagram illustrating an electron orbit in the aberration corrector according to the third embodiment.

Next, an aberration corrector according to a third embodiment of the invention will be described with reference to the drawings. FIG. 19 is a diagram illustrating an optical system of an aberration corrector 30 according to the third embodiment. FIG. 20 is a diagram illustrating an electron orbit (an X orbit and a Y orbit) in the aberration corrector 30. Hereinafter, in the aberration corrector 30 according to the third embodiment, members having similar functions to the components of the aberration corrector 10 according to the first embodiment will be denoted by same reference characters and a detailed description thereof will be omitted.

In the aberration corrector 10 and the aberration corrector 20 described above, the geometric aberration corrector 200 corrects a geometric aberration of the objective lens 14 by generating three-fold symmetric fields in two stages with multipole elements (the first multipole element 210 and the second multipole element 220) in two stages.

In contrast, in the aberration corrector 30, as illustrated in FIGS. 19 and 20, a geometric aberration corrector 300 corrects a geometric aberration of the objective lens 14 by generating three-fold symmetric fields (magnetic fields having three-fold symmetry or electric fields having three-fold symmetry) in three stages with multipole elements (a first multipole element 310, a second multipole element 320, and a third multipole element 330) in three stages.

The geometric aberration corrector 300 includes a first multipole element 310 (an example of a first optical system for geometric aberration correction) in a front stage, a second multipole element 320 (an example of a second optical system for geometric aberration correction) in a middle stage, and a third multipole element 330 (an example of a third optical system for geometric aberration correction) in a rear stage. The first multipole element 310, the second multipole element 320, and the third multipole element 330 respectively generate three-fold symmetric fields. In the geometric aberration corrector 300, a three-fold astigmatism is canceled out by synthesizing the three-fold symmetric field generated by the first multipole element 310, the three-fold symmetric field generated by the second multipole element 320, and the three-fold symmetric field generated by the third multipole element 330.

The geometric aberration corrector 300 is provided with a plurality of (in the illustrated example, two) transfer lens systems. The first multipole element 110 which functions as a transfer lens system is disposed between the first multipole element 310 and the second multipole element 320. In addition, the second multipole element 120 which functions as a transfer lens system is disposed between the second multipole element 320 and the third multipole element 330. The first multipole element 110 and the second multipole element 120 function as transfer lens systems and also function as the chromatic aberration corrector 100.

Figure 21:
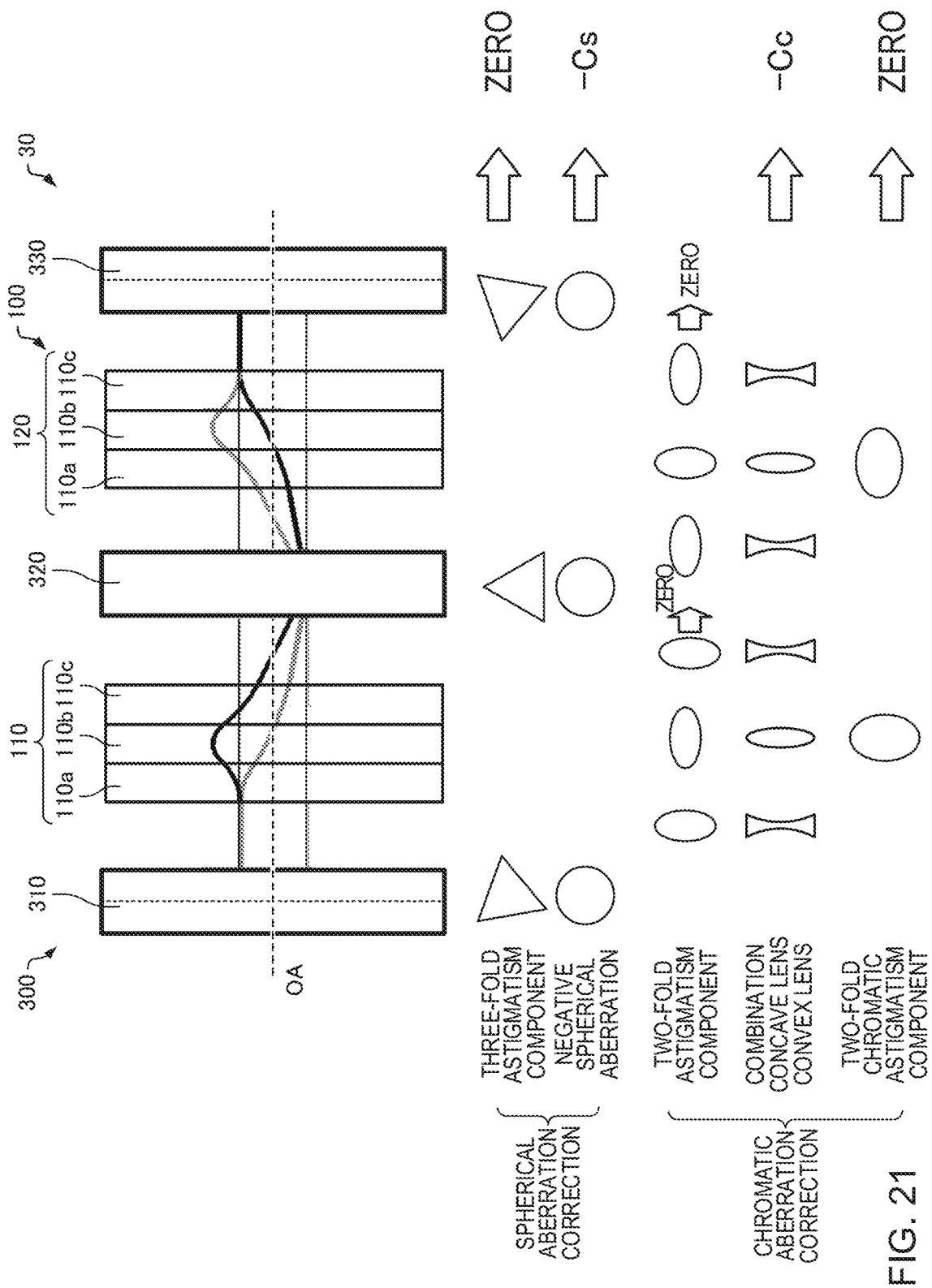
FIG. 21 is a diagram illustrating a function of the optical system of the aberration corrector according to the third embodiment.

FIG. 21 is a diagram illustrating a function of the optical system of the aberration corrector 30.

In the geometric aberration corrector 300, the three-fold symmetric field generated by the second multipole element 320 corresponds to a 40° rightward or leftward rotation around the optical axis OA of the three-fold symmetric field generated by the first multipole element 310. In addition, the three-fold symmetric field generated by the third multipole element 330 corresponds to an 80° rightward or leftward rotation around the optical axis OA of the three-fold symmetric field generated by the first multipole element 310.

Alternatively, the three-fold symmetric field generated by the second multipole element 320 may correspond to an 80° rightward or leftward rotation around the optical axis OA of the three-fold symmetric field generated by the first multipole element 310, and the three-fold symmetric field generated by the third multipole element 330 may correspond to a 40° rightward or leftward rotation around the optical axis OA of the three-fold symmetric field generated by the first multipole element 310.

In other words, one of the three-fold symmetric field generated by the second multipole element 320 and the three-fold symmetric field generated by the third multipole element 330 corresponds to a rotation of 120°×m×±40° (where m is an integer) of the three-fold symmetric field generated by the first multipole element 310, and the other of the three-fold symmetric field generated by the second multipole element 320 and the three-fold symmetric field generated by the third multipole element 330 corresponds to a rotation of 120°×m×±80° of the three-fold symmetric field generated by the first multipole element 310. However, directions of rotation of the three-fold symmetric field generated by the second multipole element 320 and the three-fold symmetric field generated by the third multipole element 330 are the same.

Due to the three-fold symmetric fields in three stages having a rotational relationship described above, a three-fold astigmatism and a six-fold astigmatism created by the three-fold symmetric fields generated by the respective multipole elements 310, 320, and 330 can be removed. In other words, a three-fold astigmatism can be canceled out by a synthesis of the three-fold symmetric fields respectively generated by the multipole elements 310, 320, and 330 in three stages.

The rotational relationship of the three-fold symmetric fields in three stages is not limited to the example described above. For example, one of the three-fold symmetric field generated by the second multipole element 320 and the three-fold symmetric field generated by the third multipole element 330 may correspond to a rotation of 120°×m× approximately ±72° (where m is an integer) of the three-fold symmetric field generated by the first multipole element 310, and the other of the three-fold symmetric field generated by the second multipole element 320 and the three-fold symmetric field generated by the third multipole element 330 may correspond to a rotation of 120°×m×approximately ±24° of the three-fold symmetric field generated by the first multipole element 310. However, directions of rotation of the three-fold symmetric field generated by the second multipole element 320 and the three-fold symmetric field generated by the third multipole element 330 are the same.

In the geometric aberration corrector 300, aberration correction is performed by utilizing a phenomenon in which a thickness along a direction of travel of an electron beam or, in other words, a three-fold symmetric field having a thickness along the optical axis OA generates a negative spherical aberration. A spherical aberration of the objective lens 14 is corrected by generating three-fold symmetric fields in three stages with the multipole elements (the first multipole element 310, the second multipole element 320, and the third multipole element 330) in three stages.

Note that the negative spherical aberrations generated by the first multipole element 310, the second multipole element 320, and the third multipole element 330 are independent of a relationship among rotation angles around the optical axis OA of the three-fold symmetric field generated by the first multipole element 310, the three-fold symmetric field generated by the second multipole element 320, and the three-fold symmetric field generated by the third multipole element 330.

In the geometric aberration corrector 300, a three-fold astigmatism and a six-fold astigmatism can be removed while generating a negative spherical aberration by having the first multipole element 310, the second multipole element 320, and the third multipole element 330 generate three-fold symmetric fields in three stages. A reason therefor is described in JP-A-2009-54565.

In the aberration corrector 30, the chromatic aberration corrector 100 has a function as a transfer lens system as well as a function of correcting a chromatic aberration. Since functions of the chromatic aberration corrector 100 are similar to the examples of the aberration corrector 10 and the aberration corrector 20 described above, a description thereof will be omitted.

For example, the aberration corrector 30 has the following features.

The aberration corrector 30 includes the geometric aberration corrector 300, the geometric aberration corrector 300 includes the multipole elements 310, 320, and 330 in three stages, the first multipole element 110 as a transfer lens system is disposed between the first multipole element 310 and the second multipole element 320, and the second multipole element 120 as a transfer lens system is disposed between the second multipole element 320 and the third multipole element 330. Therefore, with the aberration corrector 30, a spherical aberration and a chromatic aberration can be corrected. Furthermore, in the aberration corrector 30, for example, an increase in a length of the optical system can be reduced as compared to a case where, for example, a geometric aberration corrector and a chromatic aberration corrector are connected in tandem.

In the aberration corrector 30, the geometric aberration corrector 300 includes the multipole elements 310, 320, and 330 in three stages disposed along the optical axis OA, the three-fold symmetric fields respectively generated by the multipole elements 310, 320, and 330 in three stages have mutually different rotation angles around the optical axis OA, and a three-fold astigmatism is canceled out by a synthesis of the three-fold symmetric fields respectively generated by the multipole elements 310, 320, and 330 in three stages. Therefore, in the aberration corrector 30, a three-fold astigmatism and a six-fold astigmatism can be removed while generating a negative spherical aberration by the multipole elements 310, 320, and 330 in three stages.

3.4. Fourth Embodiment

Figure 22:
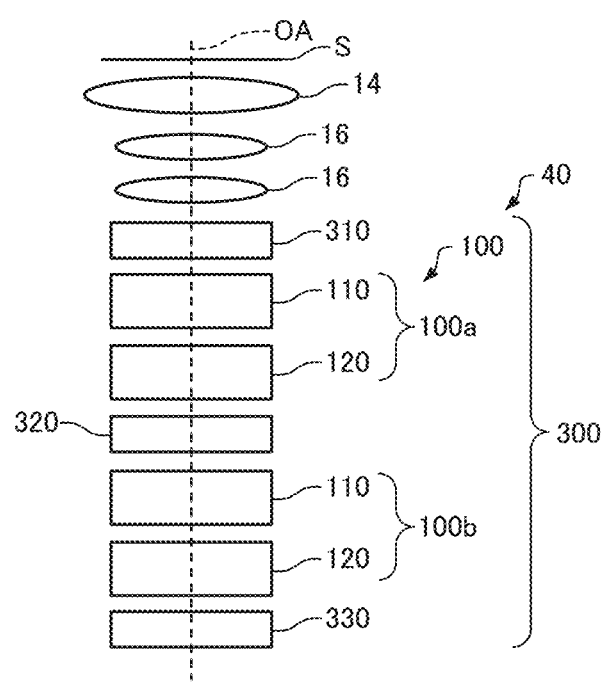
FIG. 22 is a diagram illustrating an optical system of an aberration corrector according to the fourth embodiment of the invention.
Figure 23:
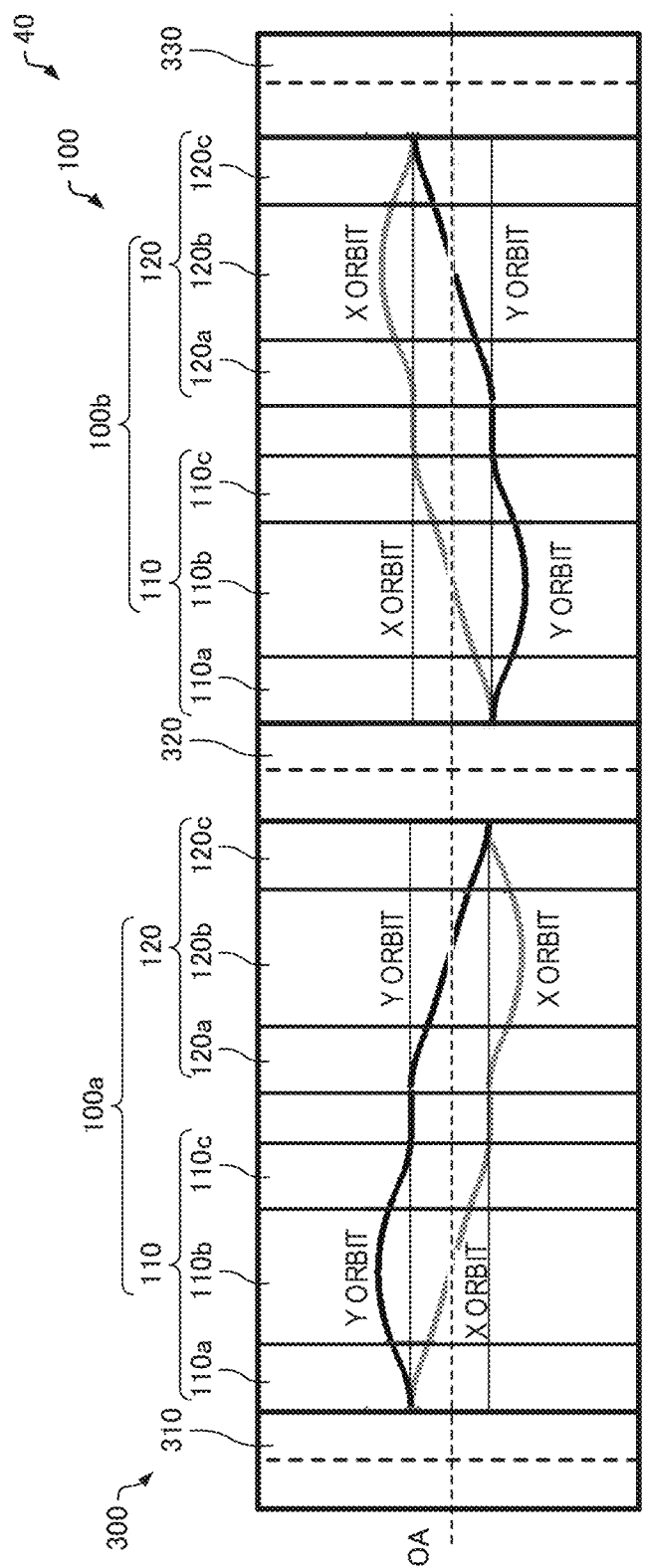
FIG. 23 is a diagram illustrating an electron orbit in the aberration corrector according to the fourth embodiment.

Next, an aberration corrector according to a fourth embodiment of the invention will be described with reference to the drawings. FIG. 22 is a diagram illustrating an optical system of an aberration corrector 40 according to the fourth embodiment. FIG. 23 is a diagram illustrating an electron orbit (an X orbit and a Y orbit) in the aberration corrector 40. Hereinafter, in the aberration corrector 40 according to the fourth embodiment, members having similar functions to the components of the aberration corrector 10 and the aberration corrector 30 described above will be denoted by same reference characters and a detailed description thereof will be omitted.

In the aberration corrector 40, the geometric aberration corrector 300 includes multipole elements 310, 320, and 330 in three stages as illustrated in FIGS. 22 and 23. In addition, multipole elements 110 and 120 in two stages as a first transfer lens system 100a are disposed between the first multipole element 310 and the second multipole element 320. Furthermore, multipole elements 110 and 120 in two stages as a second transfer lens system 100b are disposed between the second multipole element 320 and the third multipole element 330. In the aberration corrector 40, the chromatic aberration corrector 100 has two sets of the multipole elements 110 and 120 in two stages. By configuring the chromatic aberration corrector 100 to have the two sets of the multipole elements 110 and 120 in two stages, a higher-order aberration (a four-fold astigmatism) generated in the chromatic aberration corrector 100 can be removed as will be described later.

The multipole elements 310, 320, and 330 in three stages are similar in configuration to the aberration corrector 30 according to the third embodiment described above and a description thereof will be omitted.

In the first transfer lens system 100a, an image equivalent to an image obtained by the first multipole element 310 is transferred to the second multipole element 320. In the second transfer lens system 100b, an image equivalent to an image obtained by the second multipole element 320 is transferred to the third multipole element 330.

The first multipole element 110 and the second multipole element 120 of the second transfer lens system 100b are disposed by being rotated by 45° around the optical axis OA with respect to the first multipole element 110 and the second multipole element 120 of the first transfer lens system 100a.

Figure 24:
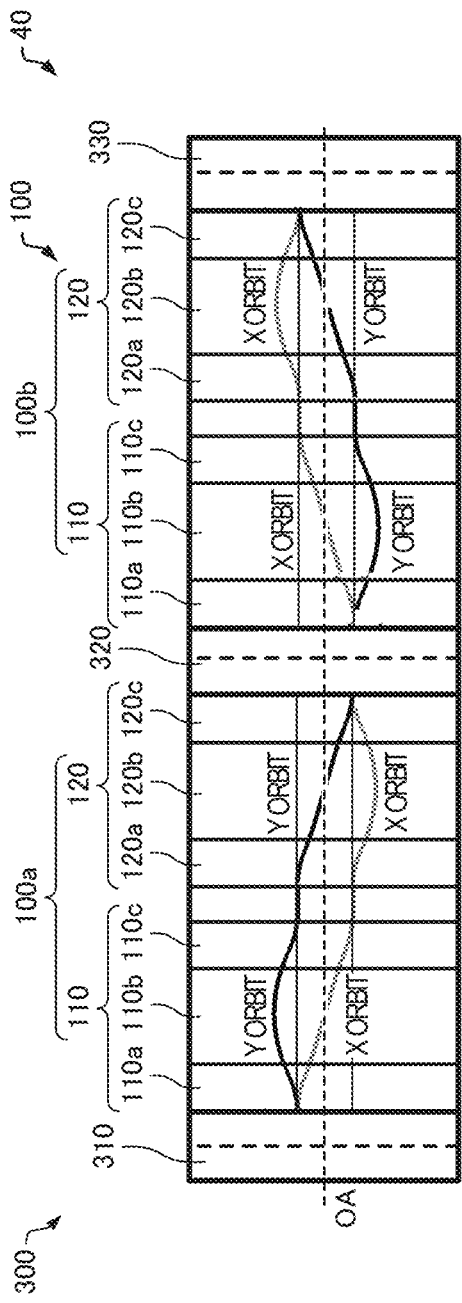
FIG. 24 is a diagram illustrating a function of the optical system of the aberration corrector according to the fourth embodiment.

FIG. 24 is a diagram illustrating a function of the optical system of the aberration corrector 40.

Functions of the geometric aberration corrector 300 are similar to the aberration corrector 30 described above and a three-fold astigmatism and a six-fold astigmatism can be removed while generating a negative spherical aberration by having the first multipole element 310, the second multipole element 320, and the third multipole element 330 generate three-fold symmetric fields in three stages.

In the chromatic aberration corrector 100, electromagnetic fields having two-fold symmetry in three stages generated by one multipole element are capable of correcting a chromatic aberration in the X direction or the Y direction depending on how the electromagnetic field is set. Therefore, in the chromatic aberration corrector 100, using the multipole elements (the first multipole element 110 and the second multipole element 120) in two stages constituting the first transfer lens system 100a, a chromatic aberration in the X direction and a chromatic aberration in the Y direction can be separately corrected and chromatic aberrations can be uniformly corrected in both the X direction and the Y direction in the system as a whole. In a similar manner, using the multipole elements (the first multipole element 110 and the second multipole element 120) in two stages constituting the second transfer lens system 100b, a chromatic aberration in the X direction and a chromatic aberration in the Y direction can be separately corrected and chromatic aberrations can be uniformly corrected in both the X direction and the Y direction in the system as a whole.

A chromatic aberration of the objective lens 14 can be corrected by a negative chromatic aberration component due to an effect of combination aberrations generated in the first multipole element 110 and the second multipole element 120.

A geometric two-fold symmetric field is not generated at an entrance and an exit of the first multipole element 110 and an entrance and an exit of the second multipole element 120 and two-fold astigmatism components are canceled out inside the respective multipole elements.

Two-fold chromatic astigmatism components are generated in the first multipole element 110 and the second multipole element 120. The two-fold chromatic astigmatism component generated in the first multipole element 110 and the two-fold chromatic astigmatism component generated in the second multipole element 120 cancel out each other and become zero as a whole.

As described above, in the chromatic aberration corrector 100, the first multipole element 110 and the second multipole element 120 of the second transfer lens system 100b are disposed by being rotated by 45° around the optical axis OA with respect to the first multipole element 110 and the second multipole element 120 of the first transfer lens system 100a. Therefore, an electromagnetic field having two-fold symmetry (a first electromagnetic field) generated by the first multipole element 110 and an electromagnetic field having two-fold symmetry (a second electromagnetic field) generated by the second multipole element 120 of the second transfer lens system 100b correspond to a 45° rotation of an electromagnetic field having two-fold symmetry (a first electromagnetic field) generated by the first multipole element 110 and an electromagnetic field having two-fold symmetry (a second electromagnetic field) generated by the second multipole element 120 of the first transfer lens system 100a.

Accordingly, a four-fold astigmatism component generated by the first multipole element 110 and the second multipole element 120 of the first transfer lens system 100a and a four-fold astigmatism component generated by the first multipole element 110 and the second multipole element 120 of the second transfer lens system 100b cancel each other out. As a result, four-fold astigmatisms generated in the chromatic aberration corrector 100 can be removed.

For example, the aberration corrector 40 has the following features.

The aberration corrector 40 is capable of correcting a spherical aberration and a chromatic aberration and, at the same time, capable of reducing an increase in the length of the optical system in a similar manner to the aberration corrector 30 described above.

Furthermore, in the aberration corrector 40, the geometric aberration corrector 300 includes the multipole elements 310, 320, and 330 in three stages, the first transfer lens system 100a is disposed between the first multipole element 310 and the second multipole element 320, and the second transfer lens system 100b is disposed between the second multipole element 320 and the third multipole element 330. In addition, the first transfer lens system 100a and the second transfer lens system 100b respectively have the multipole elements 110 and 120 in two stages. An electromagnetic field having two-fold symmetry generated by the first multipole element 110 and the second multipole element 120 of the second transfer lens system 100b corresponds to a 45° rotation of an electromagnetic field having two-fold symmetry generated by the first multipole element 110 and the second multipole element 120 of the first transfer lens system 100a.

Therefore, in the aberration corrector 40, a four-fold astigmatism generated by the chromatic aberration corrector 100 can be removed.

3.5. Fifth Embodiment

Next, an aberration corrector according to a fifth embodiment of the invention will be described with reference to the drawings. Since an optical system and an electron orbit of the aberration corrector according to the fifth embodiment are similar to those of the aberration corrector 40 illustrated in FIGS. 22 and 23, illustrations and descriptions thereof will be omitted.

Figure 25:
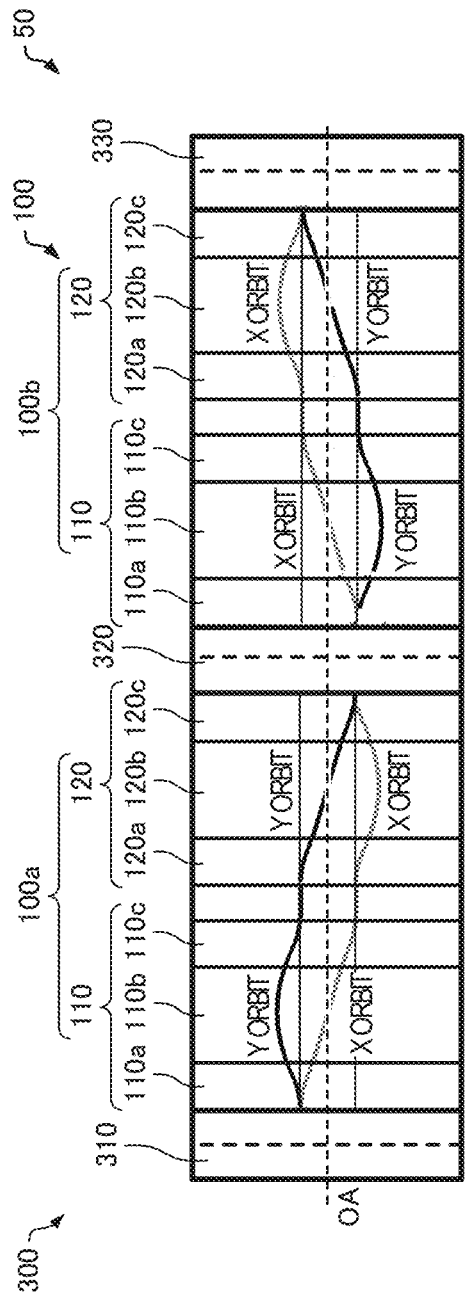
FIG. 25 is a diagram illustrating a function of an optical system of an aberration corrector according to the fifth embodiment of the invention.

FIG. 25 is a diagram illustrating a function of an optical system of an aberration corrector 50 according to the fifth embodiment.

As illustrated in FIG. 24, in the aberration corrector 40 described above, the first multipole element 110 and the second multipole element 120 of the second transfer lens system 100b are disposed by being rotated by 45° around the optical axis OA with respect to the first multipole element 110 and the second multipole element 120 of the first transfer lens system 100a in order to remove a four-fold astigmatism generated in the chromatic aberration corrector 100.

In contrast, in the aberration corrector 50, as illustrated in FIG. 25, the second multipole element 120 of the first transfer lens system 100a is disposed by being rotated by 45° with respect to the first multipole element 110 of the first transfer lens system 100a, and the second multipole element 120 of the second transfer lens system 100b is disposed by being rotated by 45° with respect to the first multipole element 110 of the second transfer lens system 100b.

Therefore, an electromagnetic field having two-fold symmetry generated by the second multipole element 120 of the first transfer lens system 100a corresponds to a 45° rotation of an electromagnetic field having two-fold symmetry generated by the first multipole element 110 of the first transfer lens system 100a. In addition, an electromagnetic field having two-fold symmetry generated by the second multipole element 120 of the second transfer lens system 100b corresponds to a 45° rotation of an electromagnetic field having two-fold symmetry generated by the first multipole element 110 of the second transfer lens system 100b.

Accordingly, a four-fold astigmatism component generated by the first multipole element 110 and a four-fold astigmatism component generated by the second multipole element 120 in the first transfer lens system 100a cancel each other out. In addition, a four-fold astigmatism component generated by the first multipole element 110 and a four-fold astigmatism component generated by the second multipole element 120 in the second transfer lens system 100b cancel each other out. As a result, four-fold astigmatisms generated in the chromatic aberration corrector 100 can be removed.

4. Electron Microscope

4.1. Sixth Embodiment

Figure 26:
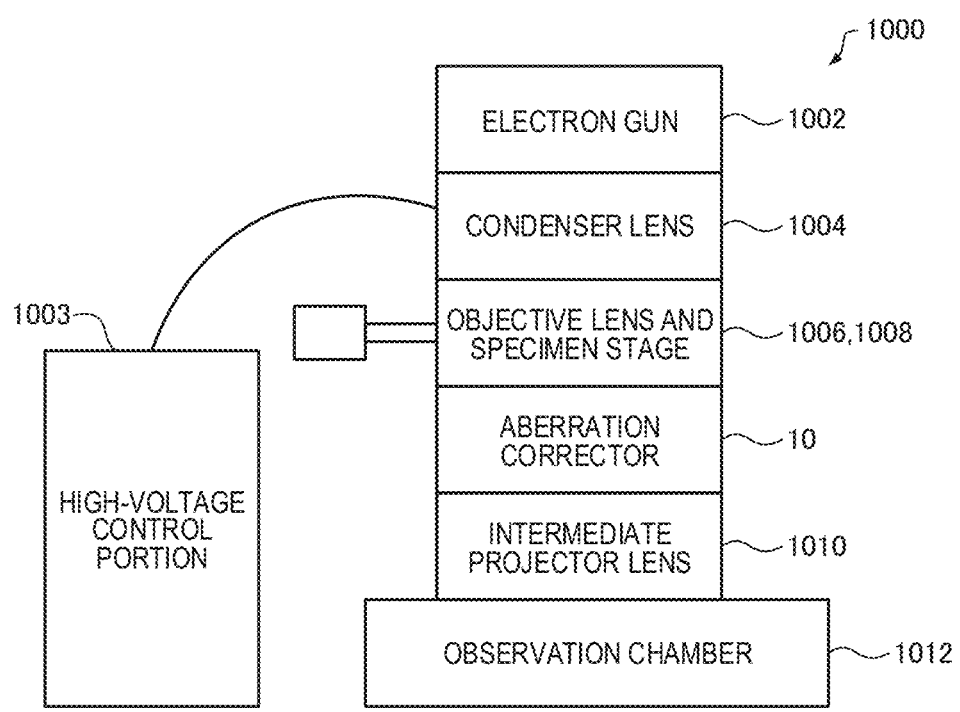
FIG. 26 is a diagram schematically illustrating an electron microscope according to the sixth embodiment.

Next, an electron microscope according to a sixth embodiment of the invention will be described with reference to the drawings. FIG. 26 is a diagram schematically illustrating an electron microscope 1000 according to the sixth embodiment.

The electron microscope 1000 includes an aberration corrector according to an embodiment of the invention. A case where the aberration corrector 10 is included as the aberration corrector according to an embodiment of the invention will now be described.

As illustrated in FIG. 26, the electron microscope 1000 is configured so as to include an electron gun 1002, a high-voltage control portion 1003, a condenser lens 1004, an objective lens 1006, a specimen stage 1008, the aberration corrector 10, an intermediate projector lens 1010, and an observation chamber 1012. In the electron microscope 1000, the aberration corrector 10 is used in order to correct an aberration of an imaging system.

The electron gun 1002 generates an electron beam. High-voltage power is supplied to the electron gun 1002 by the high-voltage control portion 1003.

The condenser lens 1004 focuses the electron beam emitted from the electron gun 1002. The condenser lens 1004 constitutes an illumination system for irradiating a specimen held on the specimen stage 1008 with the electron beam.

The objective lens 1006 is a lens in a first stage for focusing the electron beam having been transmitted through the specimen. The specimen stage 1008 holds the specimen. The electron beam having been transmitted through the specimen is incident to the aberration corrector 10.

The aberration corrector 10 is built into the imaging system of the electron microscope 1000. The aberration corrector 10 corrects a geometrical aberration and a chromatic aberration of the objective lens 1006. Specifically, in the aberration corrector 10, a positive spherical aberration of the objective lens 1006 is canceled out by a negative spherical aberration generated by the geometric aberration corrector 200 and a positive chromatic aberration of the objective lens 1006 is canceled out by a negative chromatic aberration generated by the chromatic aberration corrector 100.

The intermediate projector lens 1010 cooperates with the objective lens 1006 to constitute an imaging system for focusing the electron beam having been transmitted through the specimen. The intermediate projector lens 1010 focuses the electron beam onto a camera (not illustrated) inside the observation chamber 1012.

Since the electron microscope 1000 includes the aberration corrector 10, a spherical aberration and a chromatic aberration in the imaging system can be corrected. In addition, since the aberration corrector 10 is capable of reducing an increase in a length of the optical system, a height of the electron microscope 1000 can be reduced.

4.2. Seventh Embodiment

Figure 27:
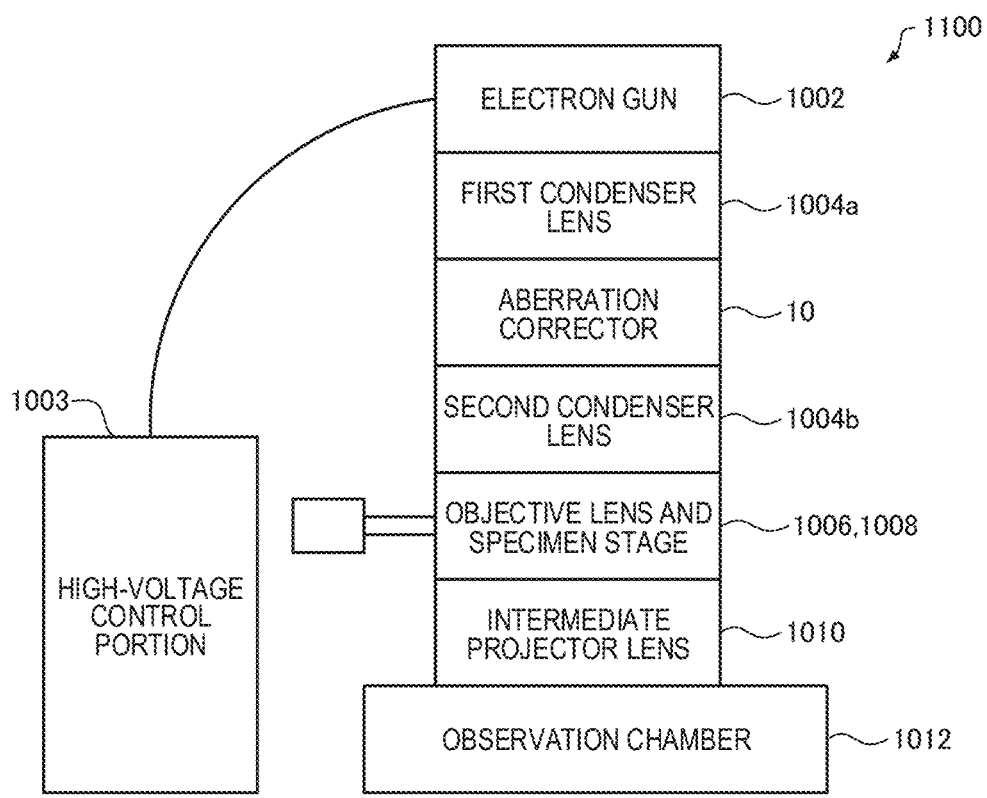
FIG. 27 is a diagram schematically illustrating an electron microscope according to the seventh embodiment.

Next, an electron microscope according to a seventh embodiment of the invention will be described with reference to the drawings. FIG. 27 is a diagram schematically illustrating an electron microscope 1100 according to the seventh embodiment. Hereinafter, members of the electron microscope 1100 with similar functions to the components of the electron microscope 1000 described above will be assigned same reference characters and detailed descriptions thereof will be omitted.

In the electron microscope 1000 described above, the aberration corrector 10 is built into the imaging system as illustrated in FIG. 26.

In contrast, in the electron microscope 1100, the aberration corrector 10 is built into the illumination system as illustrated in FIG. 27.

The electron microscope 1100 is configured so as to include an electron gun 1002, a high-voltage control portion 1003, a first condenser lens 1004a, a second condenser lens 1004b, an objective lens 1006, a specimen stage 1008, the aberration corrector 10, an intermediate projector lens 1010, and an observation chamber 1012.

The first condenser lens 1004a focuses an electron beam emitted from the electron gun 1002. The electron beam focused by the first condenser lens 1004a is incident to the aberration corrector 10.

The aberration corrector 10 corrects a geometrical aberration and a chromatic aberration of the first condenser lens 1004a. The electron beam emitted from the aberration corrector 10 is focused by the second condenser lens 1004b. Subsequently, the electron beam is incident to the objective lens 1006 and irradiated on a specimen held on the specimen stage 1008.

The electron beam having been transmitted through the specimen is guided to a detector disposed in the observation chamber 1012 by the intermediate projector lens 1010 and the electron beam is detected.

Since the electron microscope 1100 includes the aberration corrector 10, a spherical aberration and a chromatic aberration of the illumination system can be corrected. In addition, since the aberration corrector 10 is capable of reducing an increase in a length of the optical system, a height of the electron microscope 1100 can be reduced.

The above-described embodiments and modifications are examples and the invention is not limited thereto. For example, the embodiments and the modifications may be combined appropriately.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

The invention claimed is:

1. An aberration corrector for an electron microscope, the aberration corrector comprising:
   a geometric aberration corrector provided with a transfer lens system,
   the transfer lens system including an optical system for chromatic aberration correction,
   the optical system for chromatic aberration correction having a first portion, a second portion, and a third portion disposed along an optical axis, and
   each of the first portion, the second portion, and the third portion having a thickness in a direction along the optical axis and generating an electromagnetic field having two-fold symmetry in which an electric field having two-fold symmetry and a magnetic field having two-fold symmetry are superimposed,
   wherein the transfer lens system includes the optical system for chromatic aberration correction in two stages;
   a first optical system for chromatic aberration correction among the optical system for chromatic aberration correction in two stages generates a first electromagnetic field;

a second optical system for chromatic aberration correction among the optical system for chromatic aberration correction in two stages generates a second electromagnetic field;

the first optical system for chromatic aberration correction and the second optical system for chromatic aberration correction are disposed so as to be separated from each other in a direction along the optical axis;

in the first optical system for chromatic aberration correction, the electric field having two-fold symmetry is set stronger than the magnetic field having two-fold symmetry in the first portion, the magnetic field having two-fold symmetry is set stronger than the electric field having two-fold symmetry in the second portion, and the electric field having two-fold symmetry is set stronger than the magnetic field having two-fold symmetry in the third portion;

in the first optical system for chromatic aberration correction, a two-fold astigmatism component generated in the second portion is opposite in sign to two-fold astigmatism components generated in the first portion and the third portion;

in the first optical system for chromatic aberration correction, a force received by an electron beam from the electric field having two-fold symmetry and a force received by an electron beam from the magnetic field having two-fold symmetry in each of the first portion, the second portion, and the third portion are applied in mutually canceling directions; and the second electromagnetic field corresponds to a 90° rotation around the optical axis of the first electromagnetic field.

2. The aberration corrector according claim 1, wherein
the geometric aberration corrector includes optical systems for geometric aberration correction in two stages;

a first optical system for geometric aberration correction among the optical systems for geometric aberration correction in two stages generates a three-fold symmetric field;

a second optical system for geometric aberration correction among the optical systems for geometric aberration correction in two stages generates a three-fold symmetric field that is opposite in polarity to the three-fold symmetric field generated by the first optical system for geometric aberration correction; and the transfer lens system is disposed between the first optical system for geometric aberration correction and the second optical system for geometric aberration correction.

3. The aberration corrector according to claim 2, further comprising:

an optical system for higher-order aberration correction which is disposed between the first optical system for chromatic aberration correction and the second optical system for chromatic aberration correction and which corrects a higher-order aberration generated from the first electromagnetic field and the second electromagnetic field.

4. The aberration corrector according to claim 2, further comprising:

an optical system for higher-order aberration correction which is disposed between the first optical system for chromatic aberration correction and the second optical system for chromatic aberration correction and which corrects a higher-order aberration generated from a three-fold symmetric field generated by the geometric aberration corrector.

5. An aberration corrector for an electron microscope, the aberration corrector comprising:

a geometric aberration corrector provided with a transfer lens system, the transfer lens system including an optical system for chromatic aberration correction, the optical system for chromatic aberration correction having a first portion, a second portion, and a third portion disposed along an optical axis, and each of the first portion, the second portion, and the third portion having a thickness in a direction along the optical axis and generating an electromagnetic field having two-fold symmetry in which an electric field having two-fold symmetry and a magnetic field having two-fold symmetry are superimposed, wherein the geometric aberration corrector includes optical systems for geometric aberration correction in three stages;

a first optical system for geometric aberration correction in a front stage among the optical systems for geometric aberration correction in three stages generates a three-fold symmetric field;

a second optical system for geometric aberration correction in a middle stage among the optical systems for geometric aberration correction in three stages generates a three-fold symmetric field;

a third optical system for geometric aberration correction in a rear stage among the optical systems for geometric aberration correction in three stages generates a three-fold symmetric field; and a three-fold astigmatism is canceled out by a synthesis of the three-fold symmetric field generated by the first optical system for geometric aberration correction, the three-fold symmetric field generated by the second optical system for geometric aberration correction, and the three-fold symmetric field generated by the third optical system for geometric aberration correction.

6. The aberration corrector according to claim 5, wherein
the transfer lens system is disposed between the first optical system for geometric aberration correction and the second optical system for geometric aberration correction and between the second optical system for geometric aberration correction and the third optical system for geometric aberration correction.

7. The aberration corrector according to claim 5, wherein
the transfer lens system includes the optical system for chromatic aberration correction in two stages;

a first optical system for chromatic aberration correction among the optical system for chromatic aberration correction in two stages generates a first electromagnetic field;

a second optical system for chromatic aberration correction among the optical system for chromatic aberration correction in two stages generates a second electromagnetic field;

the transfer lens system is provided in plurality;

a first transfer lens system among the plurality of transfer lens systems is disposed between the first optical system for geometric aberration correction and the second optical system for geometric aberration correction;

a second transfer lens system among the plurality of transfer lens systems is disposed between the second optical system for geometric aberration correction and the third optical system for geometric aberration correction; and the first electromagnetic field of the second transfer lens system and the second electromagnetic field of the second transfer lens system are rotated by 45° with respect to the first electromagnetic field of the first transfer lens system and the second electromagnetic field of the first transfer lens system.

8. The aberration corrector according to claim 5, wherein the transfer lens system includes the optical system for chromatic aberration correction in two stages;

a first optical system for chromatic aberration correction among the optical system for chromatic aberration correction in two stages generates a first electromagnetic field;

a second optical system for chromatic aberration correction among the optical system for chromatic aberration correction in two stages generates a second electromagnetic field;

the transfer lens system is provided in plurality;

a first transfer lens system among the plurality of transfer lens systems is disposed between the first optical system for geometric aberration correction and the second optical system for geometric aberration correction;

a second transfer lens system among the plurality of transfer lens systems is disposed between the second optical system for geometric aberration correction and the third optical system for geometric aberration correction;

the second electromagnetic field of the first transfer lens system is rotated by 45° with respect to the first electromagnetic field of the first transfer lens system; and the second electromagnetic field of the second transfer lens system is rotated by 45° with respect to the first electromagnetic field of the second transfer lens system.

9. An electron microscope comprising the aberration corrector according to claim 1.

* * * * *

UNITED STATES PATENT AND TRADEMARK OFFICE
CERTIFICATE OF CORRECTION

PATENT NO. : 10,720,301 B2
APPLICATION NO. : 16/255026
DATED : July 21, 2020
INVENTOR(S) : Hidetaka Sawada Page 1 of 1

It is certified that error appears in the above-identified patent and that said Letters Patent is hereby corrected as shown below:

In the Claims

Column 25, Line 33, Claim 2, after "according" insert -- to --

Signed and Sealed this
Eighth Day of December, 2020

Andrei Iancu
*Director of the United States Patent and Trademark Office*